(12) United States Patent
Iwai et al.

(10) Patent No.: US 10,409,114 B2
(45) Date of Patent: Sep. 10, 2019

(54) DISPLAY DEVICE

(71) Applicant: Japan Display Inc., Tokyo (JP)

(72) Inventors: Yohei Iwai, Tokyo (JP); Ryosuke Imaseki, Tokyo (JP)

(73) Assignee: Japan Display Inc., Tokyo (JP)

( * ) Notice: Subject to any disclaimer, the term of this patent is extended or adjusted under 35 U.S.C. 154(b) by 3 days.

(21) Appl. No.: 15/275,717

(22) Filed: Sep. 26, 2016

(65) Prior Publication Data

US 2017/0123245 A1 May 4, 2017

(30) Foreign Application Priority Data

Nov. 4, 2015 (JP) .................................. 2015-216588

(51) Int. Cl.
| | |
|---|---|
| *G02F 1/1339* | (2006.01) |
| *G02F 1/1335* | (2006.01) |
| *G02F 1/1368* | (2006.01) |
| *G09G 3/36* | (2006.01) |
| *B32B 17/10* | (2006.01) |
| *B60J 1/00* | (2006.01) |
| *G02F 1/1333* | (2006.01) |

(Continued)

(52) U.S. Cl.
CPC ...... *G02F 1/1339* (2013.01); *B32B 17/10504* (2013.01); *B60J 1/00* (2013.01); *G02F 1/1368* (2013.01); *G02F 1/133305* (2013.01); *G02F 1/133514* (2013.01); *G02F 1/133528* (2013.01); *G09G 3/36* (2013.01); *H01L 51/5246* (2013.01); *G02F 1/1303* (2013.01); *G02F 2201/50* (2013.01); *G02F 2201/52* (2013.01); *G02F 2201/56* (2013.01); *G02F 2202/28* (2013.01); *G09G 2300/04* (2013.01)

(58) Field of Classification Search
None
See application file for complete search history.

(56) References Cited

U.S. PATENT DOCUMENTS

| | | | | |
|---|---|---|---|---|
| 5,335,103 | A * | 8/1994 | Kim ...................... | G02F 1/1339 349/154 |
| 5,517,344 | A * | 5/1996 | Hu ......................... | G02F 1/1339 349/149 |
| 9,632,365 | B2 * | 4/2017 | Yoon ...................... | G02F 1/1368 |

(Continued)

FOREIGN PATENT DOCUMENTS

JP        2013-242525 A        12/2013

*Primary Examiner* — Grant S Withers
(74) *Attorney, Agent, or Firm* — Michael Best & Friedrich LLP

(57) ABSTRACT

Color irregularity caused by color mixture in peripheral parts of the screen is avoided when a liquid crystal display device is used in a curved state. The liquid crystal display device includes a liquid crystal display panel in which a liquid crystal is sandwiched between a counter substrate and a TFT substrate having pixels formed thereon like a matrix, the TFT substrate and the counter substrate are bonded to each other with a seal member, an upper polarizing plate is arranged on the counter substrate, and a lower polarizing plate is arranged under the TFT substrate. In the liquid crystal display device, the liquid crystal display panel is curved along a curvature axis and width wsa of the seal member on each side orthogonal to the curvature axis is greater than width wsb of the seal member on each side parallel to the curvature axis.

2 Claims, 23 Drawing Sheets

(51) Int. Cl.
   *H01L 51/52*   (2006.01)
   *G02F 1/13*    (2006.01)

(56) References Cited

U.S. PATENT DOCUMENTS

| | | | | |
|---|---|---|---|---|
| 9,726,937 | B2* | 8/2017 | Sumita | G02F 1/1339 |
| 2001/0004281 | A1* | 6/2001 | Sasaki | G02F 1/1339 |
| | | | | 349/190 |
| 2002/0163615 | A1* | 11/2002 | Fujioka | G02F 1/1339 |
| | | | | 349/154 |
| 2003/0090615 | A1* | 5/2003 | Park | G02F 1/1339 |
| | | | | 349/153 |
| 2003/0169392 | A1* | 9/2003 | Park | G02F 1/1339 |
| | | | | 349/153 |
| 2004/0141143 | A1* | 7/2004 | Lee | G02F 1/1339 |
| | | | | 349/156 |
| 2004/0160566 | A1* | 8/2004 | Kawabe | G02F 1/1341 |
| | | | | 349/153 |
| 2005/0030471 | A1* | 2/2005 | Liou | G02F 1/1339 |
| | | | | 349/190 |
| 2005/0219455 | A1* | 10/2005 | Hsieh | G02F 1/1339 |
| | | | | 349/153 |
| 2006/0192915 | A1* | 8/2006 | Kimura | G02F 1/1339 |
| | | | | 349/151 |
| 2009/0115942 | A1* | 5/2009 | Watanabe | G02F 1/133305 |
| | | | | 349/96 |
| 2009/0161048 | A1* | 6/2009 | Satake | G02F 1/133305 |
| | | | | 349/110 |
| 2010/0326592 | A1* | 12/2010 | Ishitani | G02F 1/1341 |
| | | | | 156/250 |
| 2012/0268708 | A1* | 10/2012 | Chida | G02F 1/1339 |
| | | | | 349/153 |
| 2013/0188111 | A1* | 7/2013 | Koito | G02F 1/1339 |
| | | | | 349/58 |
| 2013/0321740 | A1 | 12/2013 | An et al. | |
| 2015/0168754 | A1* | 6/2015 | Im | G02F 1/1339 |
| | | | | 349/85 |
| 2015/0228704 | A1* | 8/2015 | Miyake | H01L 51/0097 |
| | | | | 257/40 |

* cited by examiner

FIG. 21C

| R |
|---|
| G |
| B |

FIG. 21D

| R |
|---|
| G |
| B |
| W |

FIG. 21E

| R | G |
|---|---|
| G | B |

FIG. 21F

| R | G |
|---|---|
| W | B |

FIG. 21G

| G | R |
|---|---|
| B | G |

FIG. 21H

| W | R |
|---|---|
| B | G |

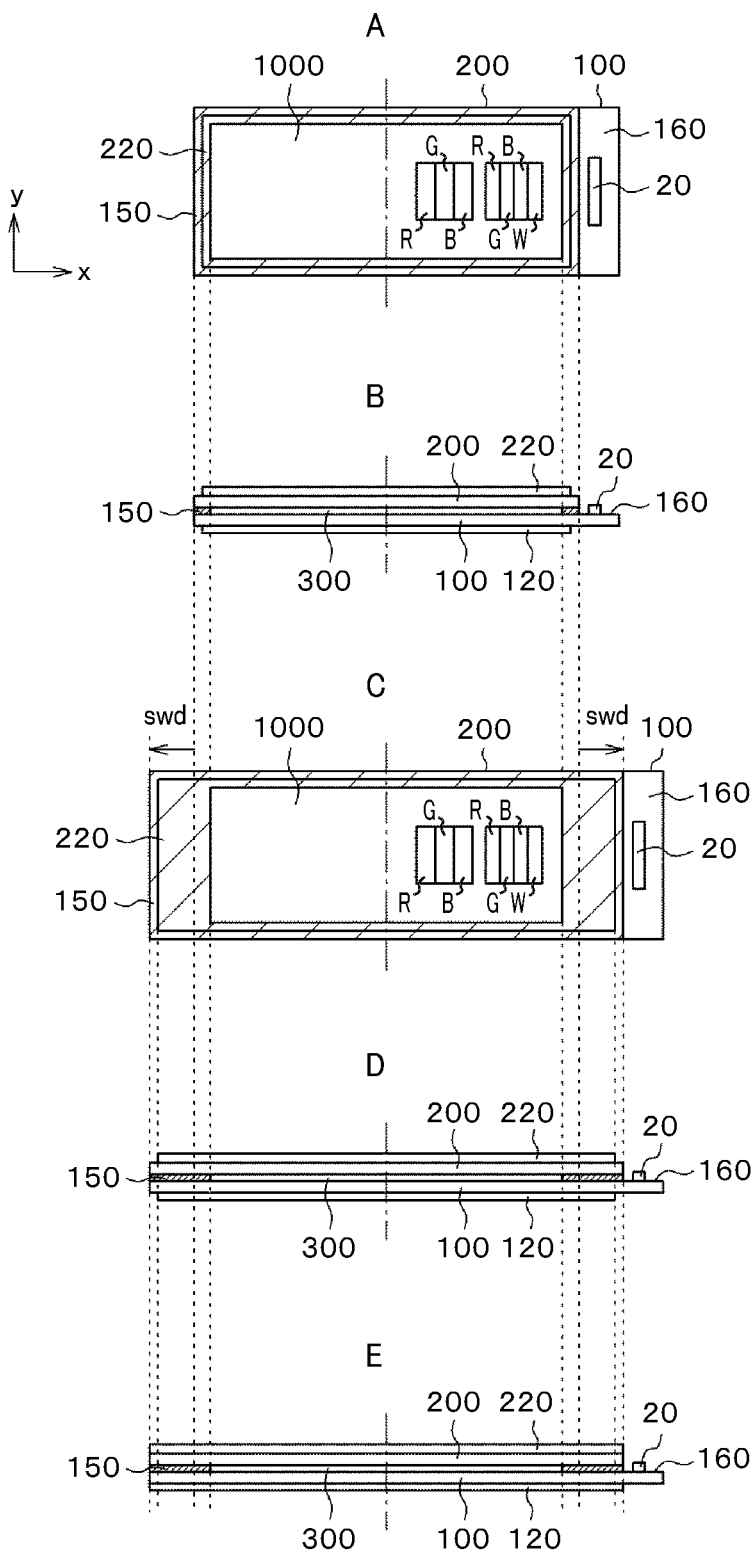

DISPLAY DEVICE

CLAIM OF PRIORITY

The present application claims priority from Japanese Patent Application JP 2015-216588 filed on Nov. 4, 2015, the content of which is hereby incorporated by reference into this application.

BACKGROUND OF THE INVENTION

1. Field of the Invention

The present invention relates to a display device, and in particular, to a liquid crystal display device having a curved screen.

2. Description of the Related Art

In a liquid crystal display device, a TFT substrate on which pixel electrodes, thin-film transistors (TFTs), etc. are formed like a matrix and a counter substrate are arranged to face each other and a liquid crystal is sandwiched between the TFT substrate and the counter substrate. The liquid crystal display device forms an image by controlling the light transmittance of liquid crystal molecules in regard to each pixel. Liquid crystal display devices are normally used as flat screens.

However, depending on the purpose such as installation in vehicles, there is a demand for screens formed in a cylindrical curved shape, for example. This is because a curved screen can offer higher visibility and/or facilitate the arrangement of the display device in some cases.

JP-A-2013-242525 describes a curved screen display panel having a rectangular display region, in which the curvature radius of the screen is changed depending on the position on the curvature axis in order to restrain color irregularity occurring depending on the position.

SUMMARY OF THE INVENTION

To increase production efficiency, liquid crystal display panels are produced by the following process: First, a lot of liquid crystal display panels are formed on a mother substrate. After the completion of the mother substrate, each liquid crystal display panel is separated from the mother substrate. The liquid crystal display panel separated from the mother substrate is in the flat state. Also in the production of curved screen displays, the production efficiency of the liquid crystal display panels can be prevented from dropping if flat liquid crystal display panels are curved in the step of assembly into liquid crystal display modules.

Meanwhile, when a flat display is curved to make its curvature axis draw an arc, the liquid crystal display panel is curved by means of bonding the liquid crystal display panel to a protective plate or the like having an arcuate cross section by using an adhesive. When the curved screen display formed as above is viewed from the front, color irregularity like that shown in FIG. 34 can occur. FIG. 34 shows a case where red color is displayed on the entire screen, wherein a left-hand part of the screen looks red R+blue B, that is, color like magenta. This indicates a state of color mixture of blue pixels into red pixels. On the other hand, a right-hand part of the screen looks red R+green G, that is, color like yellow. This indicates a state of color mixture of green pixels into red pixels. Such color mixture occurs since pixels on the TFT substrate's side (pixel regions) and pixels on the counter substrate's side (color filters) deviate from each other in the plan view in peripheral parts of the screen.

FIG. 35 is a schematic diagram showing the cause of the color mixture. In FIG. 35, a liquid crystal display panel 400 is bonded to a protective plate 50 having a curved surface by using an adhesive 55. The liquid crystal display panel 400 has the following configuration: A TFT substrate 100 on which TFTs, video signal lines, scan lines, etc. have been formed and a counter substrate 200 on which color filters have been formed are bonded to each other with a seal member 150 formed in peripheral parts. A liquid crystal 300 is sealed up in the space between the TFT substrate 100 and the counter substrate 200. A lower polarizing plate 120 is bonded to the lower side of the TFT substrate 100, while an upper polarizing plate 220 is bonded to the upper side of the counter substrate 200.

Although a flat liquid crystal display panel 400 is bonded to the protective plate 50 having a curvature radius R in FIG. 35, parts of the liquid crystal display panel 400 where the seal member 150 has been formed are hard to bend, and thus such parts differ from the other parts in the curvature radius. This effect is not confined in the parts where the seal member 150 has been formed but reaches the display region as indicated by the regions B. It can be considered that deviation has occurred between the pixels on the TFT substrate 100's side and the pixels on the counter substrate 200's side (color filters) in such parts of the display region deviating from the prescribed curvature radius and the pixel deviation has caused the color mixture. In FIG. 35, the upper side is the viewer's side.

The object of the present invention is to realize a curved screen display of high image quality by preventing the color irregularity in the peripheral parts of the curved screen display.

To achieve the above object, an aspect of the present invention provides a display device including a liquid crystal display panel in which a liquid crystal is sandwiched between a counter substrate and a TFT substrate having pixels formed thereon like a matrix, the TFT substrate and the counter substrate are bonded to each other with a seal member, an upper polarizing plate is arranged on the counter substrate, and a lower polarizing plate is arranged under the TFT substrate. In the liquid crystal display device, the liquid crystal display panel is curved along a curvature axis and width of the seal member on each side orthogonal to the curvature axis is greater than width of the seal member on each side parallel to the curvature axis.

BRIEF DESCRIPTION OF THE DRAWINGS

FIG. 21C is a plan view showing a still another arrangement of pixels.

FIG. 21D is a plan view showing a still another arrangement of pixels.

FIG. 21E is a plan view showing a still another arrangement of pixels.

FIG. 21F is a plan view showing a still another arrangement of pixels.

FIG. 21G is a plan view showing a still another arrangement of pixels.

FIG. 21H is a plan view showing a still another arrangement of pixels.

FIG. 22 is a diagram for explaining characteristics of a configuration according to the present invention in a case where a terminal unit is arranged on a short side of the liquid crystal display panel.

DESCRIPTION OF THE PREFERRED EMBODIMENTS

Embodiments of the present invention will be described in detail below by using examples.

First Embodiment

Figure 1:
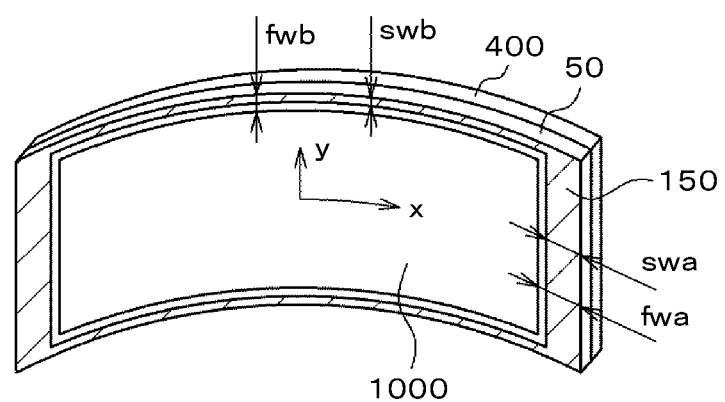
FIG. 1 is a perspective view of a liquid crystal display device in accordance with the present invention.

FIG. 1 is a perspective view of a curved screen display. The display shown in FIG. 1 has a screen having a shape that is concave on the viewer's side. In this specification, an axis in the direction in which the screen is curved will be referred to as a curvature axis. In FIG. 1, the x-axis is the curvature axis and the y-axis is an axis orthogonal to the curvature axis. Depending on the type of the display, there are also cases where the y-axis is the curvature axis. In FIG. 1, a protective panel 500 is arranged as a part nearest to the viewer and a liquid crystal display panel 400 is arranged on the back side of the protective plate 50. In the liquid crystal display panel 400, a TFT substrate and a counter substrate are bonded to each other at their peripheral parts by using a seal member, and a liquid crystal is sealed up in the space between the TFT substrate and the counter substrate.

In FIG. 1, a frame region is formed around a display region 1000, and the seal member 150 is formed in the frame region. Inner ends of the seal member 150 are situated slightly outside in comparison with inner ends of the frame region. In FIG. 1, a seal width swa on each short side is made greater than a seal width swb on each long side. This is a major feature of the present invention. Accordingly, the width fwa of the frame region on each short side is made greater than the width fwb of the frame region on each long side.

Figure 2:
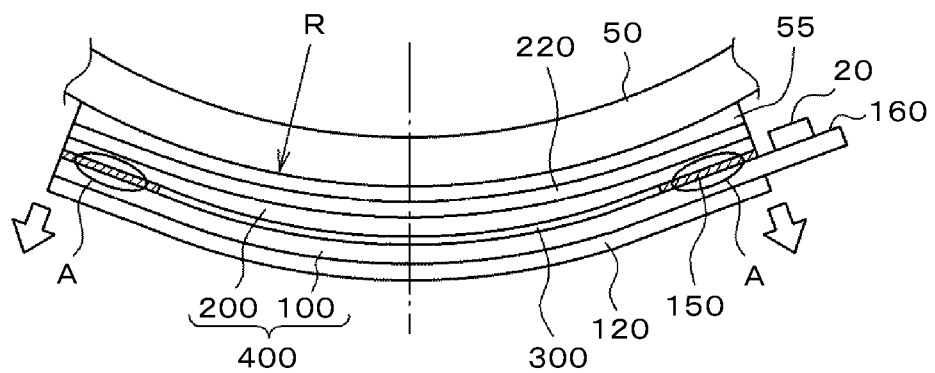
FIG. 2 is a cross-sectional view of the liquid crystal display device in accordance with the present invention.

FIG. 2 is a cross-sectional view taken in the direction of the curvature axis in FIG. 1. A terminal unit 160 and an IC driver 20 of the liquid crystal display panel 400, which are omitted in FIG. 1, are shown in FIG. 2. In FIG. 2, the liquid crystal display panel 400 is bonded to the back side of the protective plate 50 which is concave on the viewer's side by using an adhesive 55. In the liquid crystal display panel 400, the TFT substrate 100 and the counter substrate 200 are bonded to each other at their peripheral parts by using the seal member 150, and the liquid crystal 300 is sealed up in the space between the TFT substrate 100 and the counter substrate 200. The TFT substrate 100 is formed to be larger than the counter substrate 200. A part of the TFT substrate 100 not paired with the counter substrate 200 is formed as the terminal unit 160. The IC driver 20 is arranged on the terminal unit 160. A flexible wiring board for supplying video signals, etc. to the liquid crystal display panel 400 is connected to the terminal unit 160. A lower polarizing plate 120 is bonded to the lower side (farther side from the viewer) of the TFT substrate 100, while an upper polarizing plate 220 is bonded to the upper side (between the counter substrate 200 and the protective plate 50) of the counter substrate 200. Thus, the upper polarizing plate 220 of the liquid crystal display panel 400 is bonded to the protective plate 50 by using the adhesive 55.

Since the TFT substrate 100 and the counter substrate 200 are bonded to each other at their peripheral parts by using the seal member 150, bending stress is high in the parts where the seal member 150 is formed in comparison with the other parts. In other words, the parts having the seal member 150 are hard to bend in comparison with the other parts since the parts have a plate thickness as the sum total of the plate thicknesses of the TFT substrate 100 and the counter substrate 200. In the parts having the seal member 150, eight times the bending stress in other parts occurs since the bending stress of a plate is proportional to the cube of the plate thickness. Accordingly, the curvature radius becomes greater in the regions indicated by the reference character A in FIG. 2 in comparison with the other parts.

On the other hand, the liquid crystal display panel 400 is designed so that pixels formed on the counter substrate 200 and pixels formed on the TFT substrate 100 correspond to each other when the liquid crystal display panel 400 is in a prescribed curved state. Therefore, in parts where the liquid crystal display panel 400 deviates from the prescribed curvature radius, color filter regions on the counter substrate 200's side and pixel regions on the TFT substrate 100's side gradually deviate from each other. In the present invention, the seal member 150 on each side orthogonal to the curvature axis (curvature direction) is made to be wide as shown in FIG. 2, by which the parts where the curvature radius is irregular are confined in the parts where the seal member 150 is formed as indicated by the regions A and are prevented from affecting the display region 1000. In this specification, the effect causing irregular curvature in the peripheral parts of the screen as above is referred to as "spring back effect" as needed.

In contrast, if the frame region is just widened while leaving the small width of the seal member 150 unchanged, the spring back effect is not reduced much and remains in the display region 1000. Thus, the major feature of the present invention lies not in just changing the width of the frame region but in controlling the width of the seal member 150. As a result, the width of the frame region, as the width (distance) from the end of the display region 1000 to the end of the liquid crystal display panel 400, is set so that the width fwa on each side extending in the direction orthogonal to the curvature axis is greater than the width fwb on each side extending in the direction parallel to the curvature axis. Incidentally, other members such as a touch panel may be arranged between the liquid crystal display panel 400 and the protective plate 50 in any embodiment of the present invention.

Figure 3A:
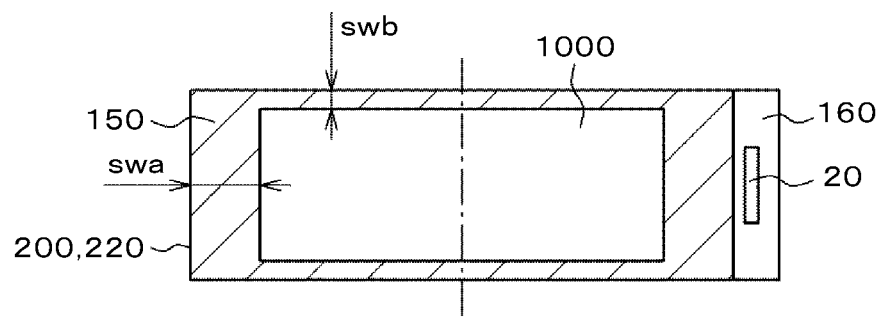
FIG. 3A is a plan view of a liquid crystal display panel in accordance with the present invention.
Figure 3B:
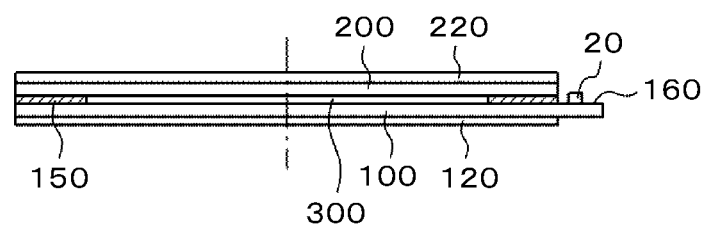
FIG. 3B is a cross-sectional view of the liquid crystal display panel shown in FIG. 3A.

FIG. 3A is a plan view of a liquid crystal display panel in the present invention before being curved. In FIG. 3A, the width swa of the seal member 150 on the short side is greater than the width swb of the seal member 150 on the long side. FIG. 3B is a cross-sectional view taken along a long axis of FIG. 3A. In FIGS. 3A and 3B, the upper polarizing plate 220 is formed in the same size as the counter substrate 200. The lower polarizing plate 120 arranged on the lower side of the TFT substrate 100 is also formed in the same size as the counter substrate 200.

Figure 4A:
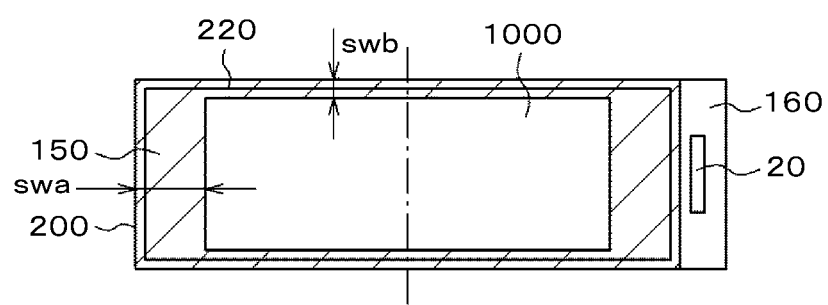
FIG. 4A is a plan view of another example of a liquid crystal display panel in accordance with the present invention.
Figure 4B:
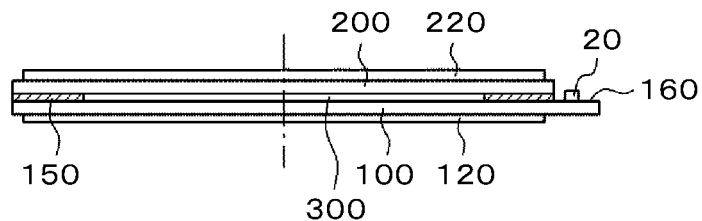
FIG. 4B is a cross-sectional view of the liquid crystal display panel shown in FIG. 4A.

FIG. 4A is a plan view showing another example of a liquid crystal display panel in the present invention before being curved. In FIG. 4A, the width swa of the seal member on the short side is greater than the width swb of the seal member on the long side. FIG. 4B is a cross-sectional view taken along a long axis of FIG. 4A. FIGS. 4A and 4B differ from FIGS. 3A and 3B in that the upper polarizing plate 220 is formed to be slightly smaller than the counter substrate 200.

Both of the configuration shown in FIGS. 3A and 3B and the configuration shown in FIGS. 4A and 4B achieve the effect of the present invention. However, the effect of the present invention is achieved more remarkably when the upper polarizing plate 220 is formed in the same size as the counter substrate 200 as shown in FIGS. 3A and 3B. Incidentally, the upper polarizing plate 220 and the counter substrate 200 being in the same size means that the length of the upper polarizing plate 220 in the curvature axis direction and the length of the counter substrate 200 in the curvature axis direction coincide with each other within an error of 0.1 mm.

On the other hand, to form the upper polarizing plate 220 and the counter substrate 200 in the same size and bond them together, accuracy of the bonding becomes essential. In contrast, the configuration shown in FIGS. 4A and 4B does not require such high bonding accuracy. Incidentally, as shown in FIGS. 3A and 4A, there are two sides orthogonal to the curvature axis. It is desirable that both of the widths of the seal member 150 on the two sides orthogonal to the curvature axis be greater than the widths of the seal member 150 on the two sides parallel to the curvature axis. It is also possible to set the length of the upper polarizing plate 220 in the curvature axis direction greater than the length of the counter substrate 200 in the curvature axis direction, that is, to make the upper polarizing plate 220 protrude from the counter substrate 200 in the curvature axis direction.

Figure 5:
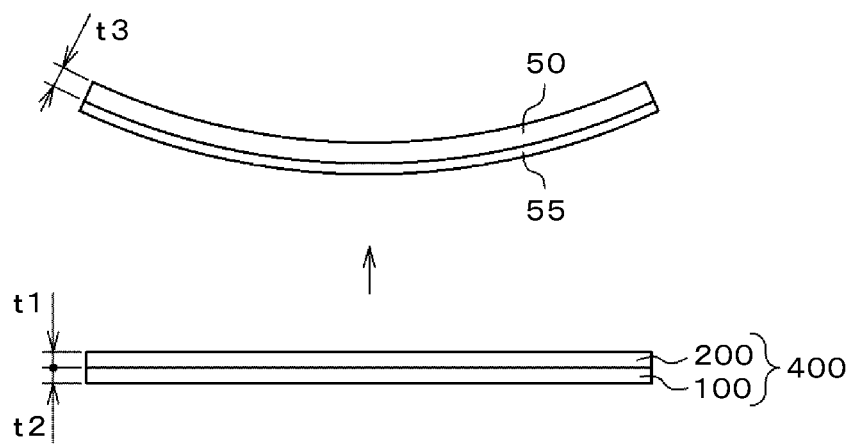
FIG. 5 is a production process diagram of a curved liquid crystal display panel.

FIG. 5 is a schematic cross-sectional view showing a production method of a liquid crystal display device according to the present invention. The protective plate 50 is previously curved at a prescribed curvature. The curvature radius R is set less than or equal to 1000 mm, for example. Depending on the purpose, the curvature radius R is set less than or equal to 500 mm. As the material of the protective plate 50, glass is desirable. Besides, transparent resins such as acrylic and polycarbonate are usable. The thickness of the protective plate 50 is desired to be greater than or equal to 0.5 mm, for example, but is not particularly limited. The adhesive 55 is applied on the surface of the protective plate 50 to which the liquid crystal display panel 400 is to be bonded. The adhesive 55 can either be adhesive material or thermosetting/ultraviolet-curing resin. The thickness of the adhesive 55 is 30 μm, for example.

In FIG. 5, the liquid crystal display panel 400 is still in the flat state. The TFT substrate 100 and the counter substrate 200 have been bonded to each other at their peripheral parts with the seal member. In FIG. 5, the thickness t1 of the counter substrate 200 is less than or equal to 0.2 mm. For a small curvature radius, the thickness t1 is desired to be less than or equal to 0.15 mm, for example. The thickness t2 of the TFT substrate 100 is also less than or equal to 0.2 mm. For a small curvature radius, the thickness t2 is desired to be less than or equal to 0.15 mm, for example. The counter substrate 200 and the TFT substrate 100 are generally formed with glass. The upper polarizing plate 220 and the lower polarizing plate 120 are omitted in FIG. 5. In the following explanation, the combination of the counter substrate 200 and the TFT substrate 100 before the upper polarizing plate 220 and the lower polarizing plate 120 are bonded thereto can also be referred to as the liquid crystal display panel 400.

Figure 6:
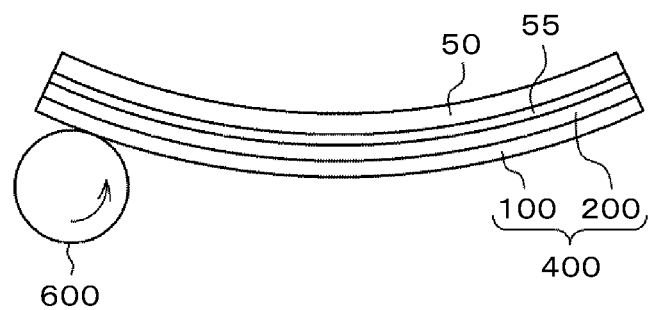
FIG. 6 is a production process diagram of the curved liquid crystal display panel.

FIG. 6 is a cross-sectional view showing a state in which a flat liquid crystal display panel 400 is being bonded to the protective plate 50 along its convex surface. FIG. 6 illustrates an example in which the adhesive 55 is formed of an adhesive material, for instance. In FIG. 6, the liquid crystal display panel 400 is pressed against the protective plate 50 by a roller 600 to make the liquid crystal display panel 400 curve along the curved surface of the protective plate 50. Since the total plate thickness (t1+t2) of the TFT substrate 100 and the counter substrate 200 is less than the plate thickness t3 of the protective plate 50, the liquid crystal display panel 400 is bonded in conformity with the curvature of the protective plate 50. Depending on the curvature radius, the total plate thickness (t1+t2) of the TFT substrate 100 and the counter substrate 200 may also be greater than the plate thickness t3 of the protective plate.

Incidentally, the method for forming the curved screen of the liquid crystal display panel is not limited to the method using the protective plate shown in FIGS. 5 and 6. A major feature of the present invention is the prevention of the deviation occurring between the pixels of the TFT substrate and the pixels of the counter substrate due to the stress in the vicinity of the seal part when the liquid crystal display panel is curved. With this feature, the color mixture and the decrease in the resolution are prevented.

Figure 7:
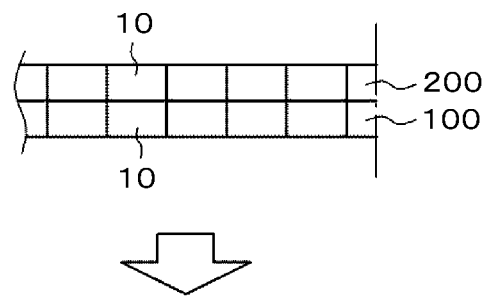
FIG. 7 is a cross-sectional schematic diagram showing pixel arrangement of a flat liquid crystal display panel.
Figure 8:
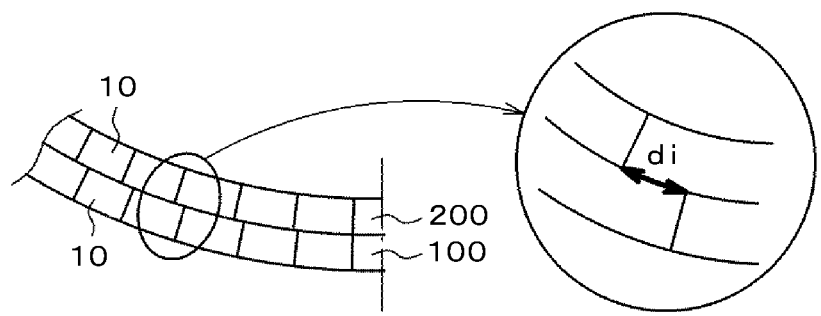
FIG. 8 is a cross-sectional schematic diagram showing a state in which pixel deviation has occurred in a curved liquid crystal display panel.

FIG. 7 is a schematic diagram showing the positional relationship between pixels 10 formed on the TFT substrate 100's side and pixels 10 formed on the counter substrate 200's side when the liquid crystal display panel is in the flat state. In FIG. 7, the pixels 10 on the TFT substrate 100's side (regions specified by signal lines and pixel electrodes) and the corresponding pixels 10 on the counter substrate 200's side (regions specified by openings of the black matrix and color filters formed at the openings) coincide with each other. FIG. 8 is a cross-sectional schematic diagram showing a case where a deviation has occurred between the pixels 10 on the TFT substrate 100's side and the pixels 10 on the counter substrate 200's side in a state in which the liquid crystal display panel shown in FIG. 7 has been curved. FIG. 8 illustrates the occurrence of the deviation di between the pixels on the TFT substrate 100's side and the pixels on the counter substrate 200's side due to the curving of the liquid crystal display panel. In the production of curved screen displays, there are cases where the pixels on the TFT substrate and the pixels on the counter substrate are arranged at positions previously shifted from each other so that the deviation di becomes 0 when the liquid crystal display panel is curved at the prescribed curvature radius.

Figure 9:
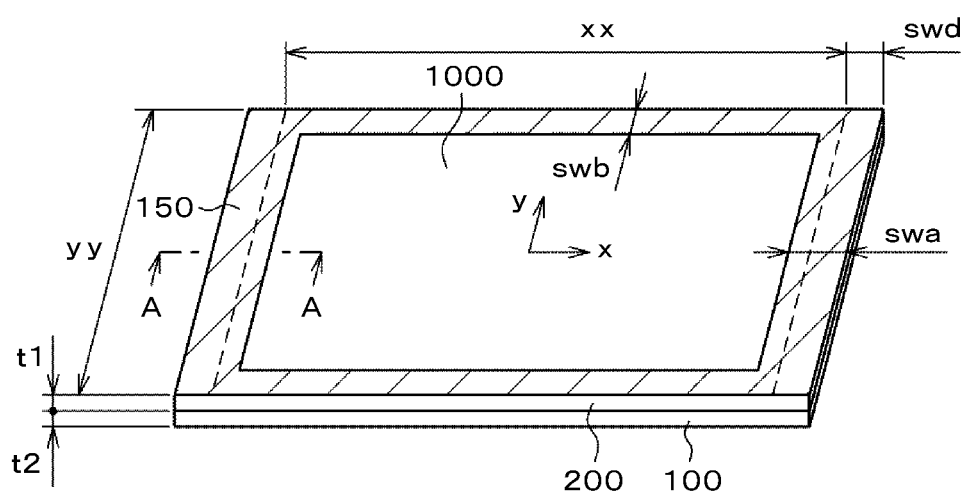
FIG. 9 is a perspective view of a flat liquid crystal display panel in the present invention.

FIG. 9 is a perspective view of the liquid crystal display panel in the flat state. In FIG. 9, the TFT substrate 100 and the counter substrate 200 are bonded to each other with the seal member 150. In FIG. 9, the long axis length (length of a long side) and the short axis length (length of a short side) of the liquid crystal display panel are xx and yy, respectively. In the present invention, the pixel deviation occurring when the liquid crystal display panel is curved is reduced by setting the width swa of the seal member on the short side greater than the width swb of the seal member on the long side by swd. In this specification, swd is referred to as a seal width increment swd.

Figure 10:
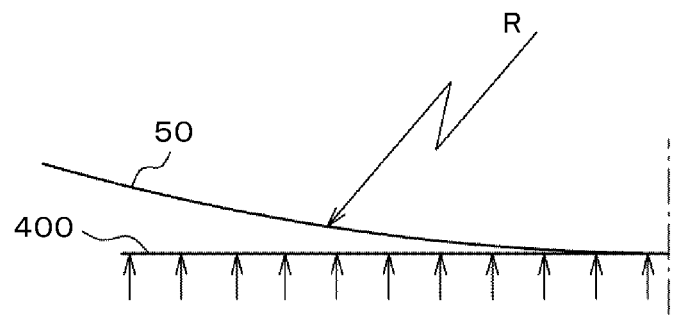
FIG. 10 is a cross-sectional schematic diagram showing a state in which the flat liquid crystal display panel is formed into a curved shape.
Figure 11:
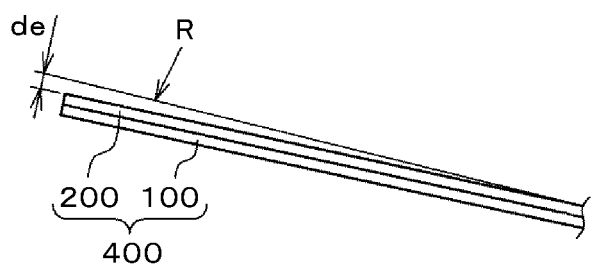
FIG. 11 is a cross-sectional schematic diagram showing a shift (lift de) of a curved liquid crystal display panel from a prescribed curvature radius.

FIG. 10 is a cross-sectional schematic diagram showing a state in which force indicated by the arrows is applied to the flat liquid crystal display panel 400 to curve it along the surface of the protective plate 50 having the prescribed curvature radius R (e.g., R=500 mm) as explained referring to FIGS. 5 and 6. Even if the liquid crystal display panel 400 is pressed against the protective plate 50 as illustrated, the liquid crystal display panel 400 shifts from the surface of the protective plate 50 having the prescribed curvature radius R due to the spring back effect. This state is shown in FIG. 11. In this specification, the amount of the shift is defined as a "lift de" from the prescribed curved surface at an end of the liquid crystal display panel 400.

With the increase in the lift de, the deviation di shown in FIG. 8 increases. The following data indicate the relationship among the seal width increment swd, the lift de, the deviation di, etc. by using a case where the long axis length xx is 247 mm, the short axis length xx is 95 mm, the thickness t1 of the counter substrate 200 is 0.15 mm and the thickness t2 of the TFT substrate 100 is 0.15 mm in the liquid crystal display panel 400 shown in FIG. 9 and a case where the curvature radius R of the protective plate 50 shown in FIG. 11 is 500 mm as reference examples.

Figure 12:
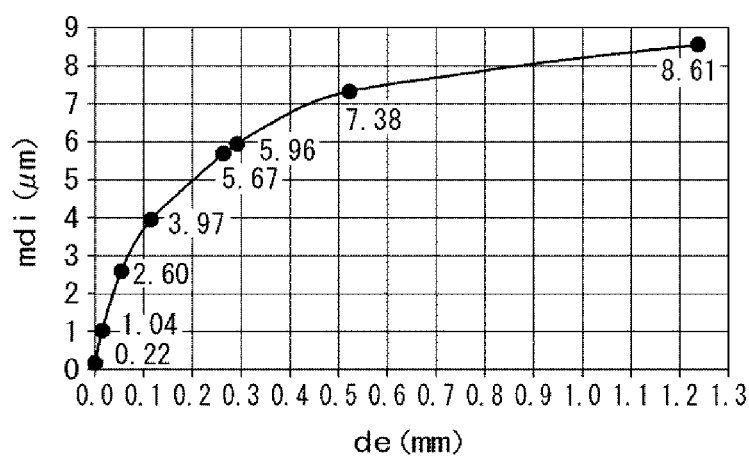
FIG. 12 is a graph showing the relationship between the lift de and a deviation di of pixels.

FIG. 12 is a graph showing the relationship between the lift de and the deviation di. In FIG. 12, the horizontal axis represents the lift de and the vertical axis represents a maximum deviation mdi. The maximum deviation mdi is used for the vertical axis since the deviation di varies depending on the position. The deviation di hits the maximum in the peripheral part of the screen. In the example of FIG. 12, the pixels are arranged so that the maximum deviation mdi becomes zero when the lift de is zero. However, the maximum deviation mdi increases with the increase in the lift de and amounts to 8.61 μm when the lift de is approximately 1.24 mm. This is a large value in a high-definition screen.

Figure 13:
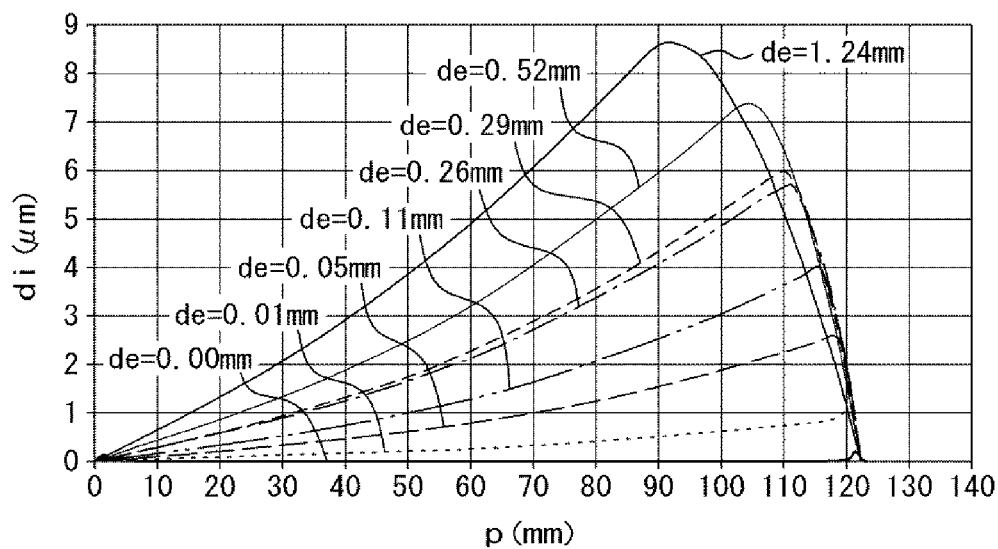
FIG. 13 is a graph showing the relationship between an on-screen position p and the pixel deviation di, wherein the lift de is used as a parameter.

FIG. 13 is a graph showing the deviation di varying depending on the position, wherein the lift de is used as a parameter. In FIG. 13, the horizontal axis represents the distance p from a screen center on a long axis as the curvature axis, and the vertical axis represents the deviation di. The deviation di is evaluated in regard to eight stages of lifts de from 0 mm to 1.24 mm. In FIG. 13, when the lift de is zero, the deviation di is also small. However, the deviation di increases with the increase in the lift de. Further, although the deviation di is zero at the screen center, the deviation di increases towards the peripheral part of the screen and hits the maximum at a position slightly inside the inner edge of the edge part of the liquid crystal display panel. In the edge part of the liquid crystal display panel, the deviation di approaches zero since the counter substrate 200 and the TFT substrate 100 are bound to each other by the seal member.

Figure 14:
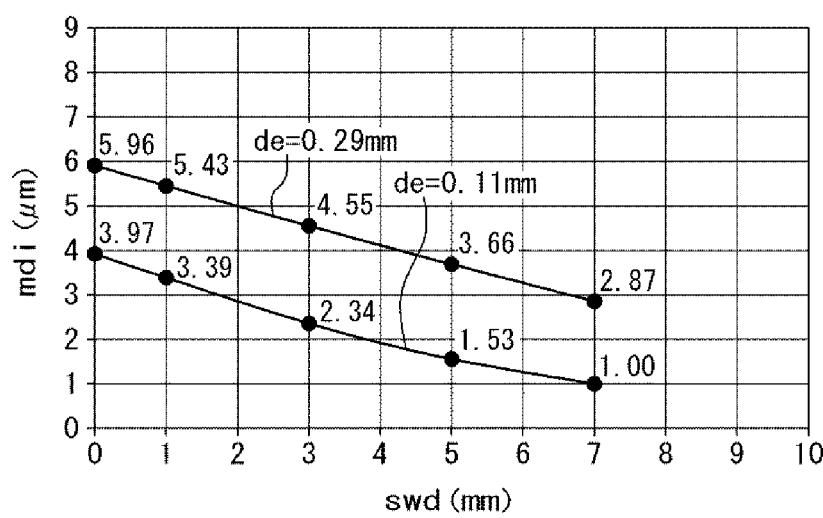
FIG. 14 is a graph showing the relationship between a seal width increment swd and a maximum deviation mdi of pixels.

In the present invention, the amount of the deviation di is reduced by increasing the seal member width in the curvature axis direction (x direction) by swd compared with the seal member width in the direction orthogonal to the curvature axis (y direction) as shown in FIG. 9. FIG. 14 shows evaluation of the maximum deviation mdi by changing the seal width increment swd and using the lift de as a parameter.

In FIG. 14, the width of the seal member used as the reference is 0.6 mm. In FIG. 14, in the case where the lift de is 0.29 mm, the maximum deviation mdi is 5.96 μm when the seal width increment swd is zero, that is, when the present invention is not employed. However, the maximum deviation mdi decreases to 2.87 μm when the seal width increment swd is 7 mm. In the case where the lift de is 0.11 mm, the maximum deviation mdi is 3.97 μm when the seal width increment swd is zero, that is, when the present invention is not employed. However, the maximum deviation mdi decreases to 1 μm when the seal width increment swd is 7 mm. To sum up, by setting the seal width increment swd at 7 mm, the deviation di can be reduced by approximately 3 μm.

In FIG. 14, the width of the seal member is 0.6 mm when the seal width increment swd is zero. Although the width of the seal member is 1.2 mm when the seal width increment swd is 0.6 mm, even such a small amount of seal width increment swd achieves a certain level of effect on the deviation di. In FIG. 14, when the seal width increment swd is approximately 2.4 mm, that is, when the width of the seal member is approximately five times the reference seal member width 0.6 mm, an effect of 1.2 μm or more can be achieved on the deviation di. Further, when the seal width increment swd is approximately 7 mm, that is, when the width of the seal member is approximately thirteen times the reference seal member width, the effect of reducing the deviation di shows a tendency to be saturated. Thus, according to FIG. 14, the effect tends to be achieved remarkably when the seal width is greater than or equal to twice (more preferably, five times) the reference seal member width and less than or equal to thirteen times the reference seal member width.

Figure 15:
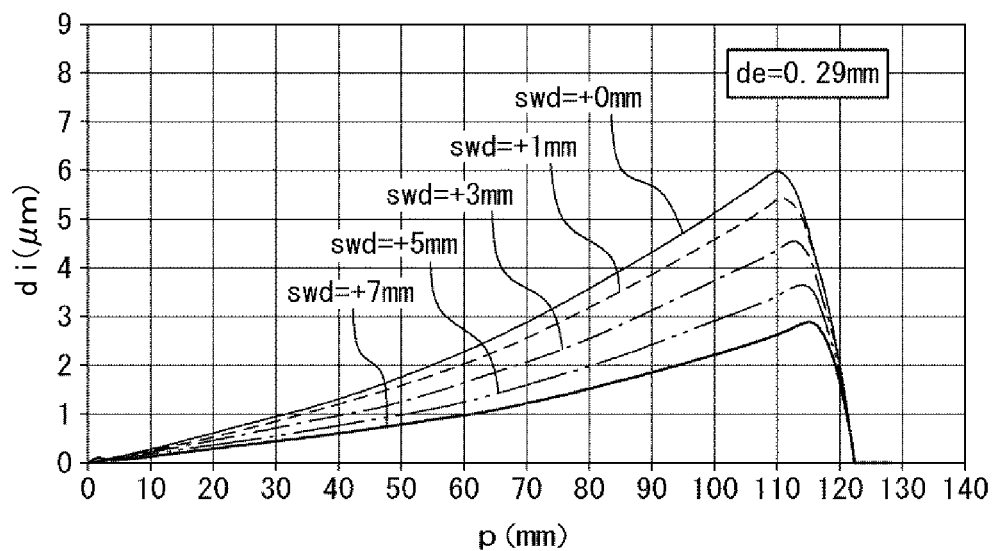
FIG. 15 is a graph showing the relationship between the on-screen position and the pixel deviation di when the lift de is 0.29 mm and the seal width increment swd is used as a parameter.

FIG. 15 is a graph showing the relationship between the distance from the screen center and the deviation di when the lift de is 0.29 mm and the seal width increment swd is used as a parameter. In FIG. 15, the horizontal axis represents the distance p from the screen center and the vertical axis represents the deviation di. The evaluation in FIG. 15 is made in regard to five stages of seal width increments swd from 0 mm (i.e., when the present invention is not employed) to 7 mm. The deviation di increases towards the peripheral part of the screen and hits the maximum in the vicinity of the edge part of the liquid crystal display panel. In the edge part of the liquid crystal display panel, the deviation di approaches zero since the counter substrate 200 and the TFT substrate 100 are bound to each other by the seal member.

Figure 16:
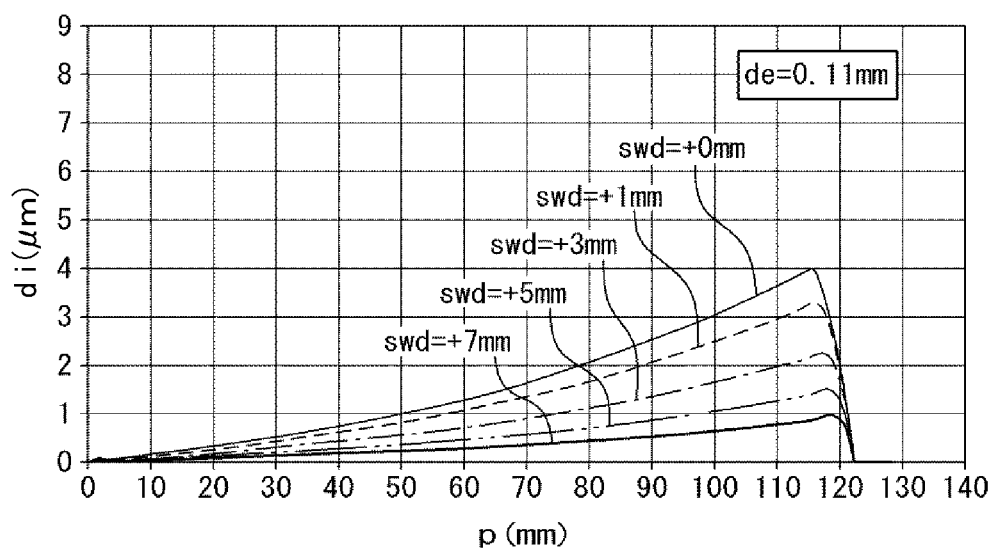
FIG. 16 is a graph showing the relationship between the on-screen position and the pixel deviation di when the lift de is 0.11 mm and the seal width increment swd is used as a parameter.

FIG. 16 is a graph showing the relationship between the distance from the screen center and the deviation di when the lift de is 0.11 mm and the seal width increment swd is used as a parameter. In FIG. 16, the horizontal axis represents the distance p from the screen center and the vertical axis represents the deviation di. The evaluation in FIG. 16 is made in regard to five stages of seal width increments swd from 0 mm (i.e., when the present invention is not employed) to 7 mm. The deviation di increases towards the peripheral part of the screen and hits the maximum in the vicinity of the edge part of the liquid crystal display panel. In the edge part of the liquid crystal display panel, the deviation di approaches zero since the counter substrate 200 and the TFT substrate 100 are bound to each other by the seal member. To sum up, with the decrease in the lift de, the absolute amount of the deviation di decreases, but the change in the deviation di remains similar.

FIGS. 14 through 16 indicate evaluation of the influence of the seal width increment swd on the deviation di when the lift de is constant. Specifically, FIGS. 14 through 16 indicate that a permissible lift de can be increased by increasing the seal width increment swd. On the other hand, the size of the liquid crystal display panel also has relevance to the lift de and the deviation di. Specifically, the lift de and the deviation di are expected to increase with the increase in the size of the liquid crystal display panel. Further, the lift de and the deviation di are also influenced by the curvature radius of the curved liquid crystal display panel, the plate thickness of the TFT substrate, the plate thickness of the counter substrate, and so forth.

Figure 17:
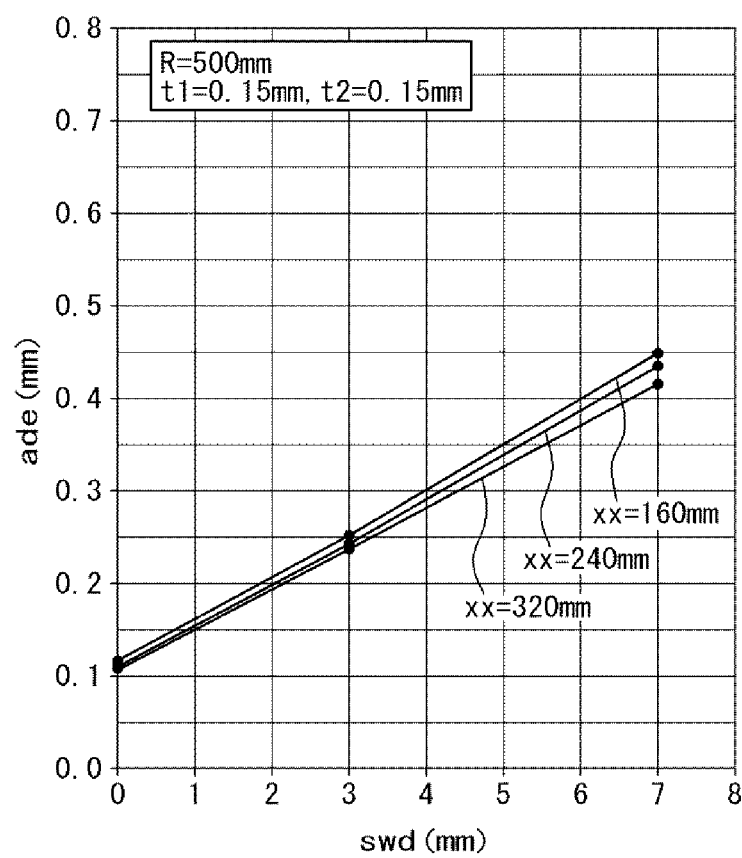
FIG. 17 is a graph showing the relationship between the seal width increment swd and an allowable lift ade when a panel width xx is used as a parameter.

FIG. 17 is a graph showing evaluation of the seal width increment swd and the permissible lift de in cases where the long axis length xx of the liquid crystal display panel is 160 mm, 240 mm and 320 mm. In these cases, the long axis coincides with the curvature axis. The curvature radius R of the liquid crystal display panel is 500 mm, the thickness of the TFT substrate 100 is 0.15 mm, and the thickness of the counter substrate 200 is 0.15 mm. In FIG. 17, the horizontal axis represents the seal width increment swd and the vertical axis represents the permissible lift ade. This amount will hereinafter be referred to as an allowable lift ade. The allowable lift ade increases with the increase in the seal width increment swd. Further, the allowable lift ade increases with the decrease in the long axis length of the liquid crystal display panel.

Figure 18:
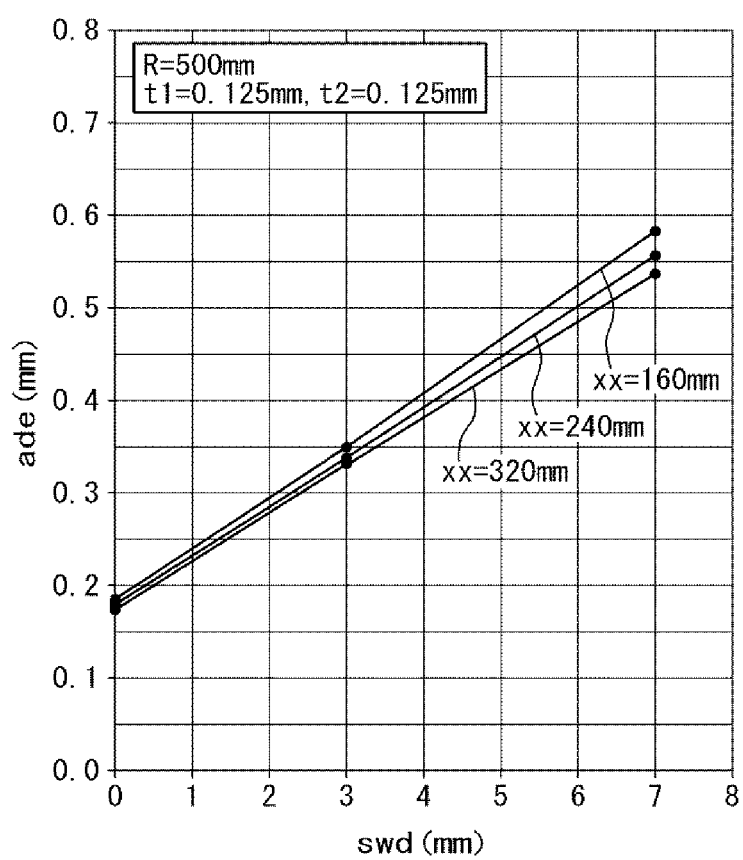
FIG. 18 is a graph showing the relationship between the seal width increment swd and the allowable lift ade when the panel width xx is used as a parameter in a case where a plate thickness of the liquid crystal display panel is changed.

The allowable lift ade changes depending also on the curvature radius R and the thickness of the liquid crystal display panel. FIG. 18 indicates cases where the curvature radius R of the liquid crystal display panel is 500 mm, the thickness of the TFT substrate is 0.125 mm, and the thickness of the counter substrate is 0.125 mm, wherein the plate thicknesses of the TFT substrate and the counter substrate are set smaller in comparison with the cases of FIG. 17. The graph of FIG. 18 also shows evaluation of the seal width increment swd and the permissible lift de in cases where the long axis length xx of the liquid crystal display panel is 160 mm, 240 mm and 320 mm. In FIG. 18, the horizontal axis represents the seal width increment swd and the vertical axis represents the permissible lift ade. The allowable lift ade increases with the increase in the seal width increment swd. Further, the allowable lift ade increase with the decrease in the long axis length of the liquid crystal display panel.

Comparing the case where the long axis length xx of the liquid crystal display panel is 240 mm with the corresponding case in FIG. 17, when the seal width increment swd is 7 mm, the allowable lift ade in FIG. 18 is 0.55 mm, whereas the allowable lift ade in FIG. 17 is 0.44 mm. To sum up, the allowable lift ade increases with the decrease in the plate thicknesses.

Figure 19:
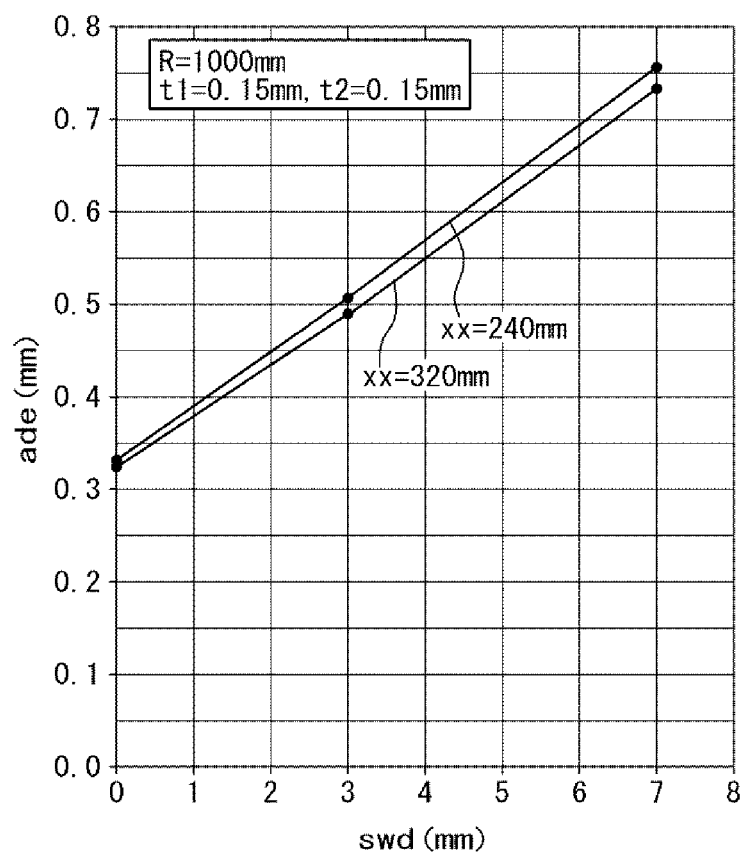
FIG. 19 is a graph showing the relationship between the seal width increment swd and the allowable lift ade when the panel width xx is used as a parameter in a case where the curvature radius of the liquid crystal display panel is changed.

FIG. 19 indicates cases where the curvature radius R of the liquid crystal display panel is 1000 mm, the thickness of the TFT substrate is 0.15 mm, and the thickness of the counter substrate is 0.15 mm, wherein the curvature radius is set greater in comparison with the cases of FIG. 17. The graph of FIG. 19 shows evaluation of the seal width increment swd and the permissible lift de in cases where the long axis length xx of the liquid crystal display panel is 240 mm and 320 mm. In FIG. 19, the horizontal axis represents the seal width increment swd and the vertical axis represents the allowable lift ade. The allowable lift ade increases with the increase in the seal width increment swd. Further, the allowable lift ade increase with the decrease in the long axis length of the liquid crystal display panel. Comparing the case where the long axis length xx of the liquid crystal display panel is 240 mm with the corresponding case in FIG. 17, when the seal width increment swd is 7 mm, the allowable lift ade in FIG. 19 is 0.76 mm, whereas the allowable lift ade in FIG. 17 is 0.44 mm. To sum up, the allowable lift ade decreases with the decrease in the curvature radius.

Figure 20:
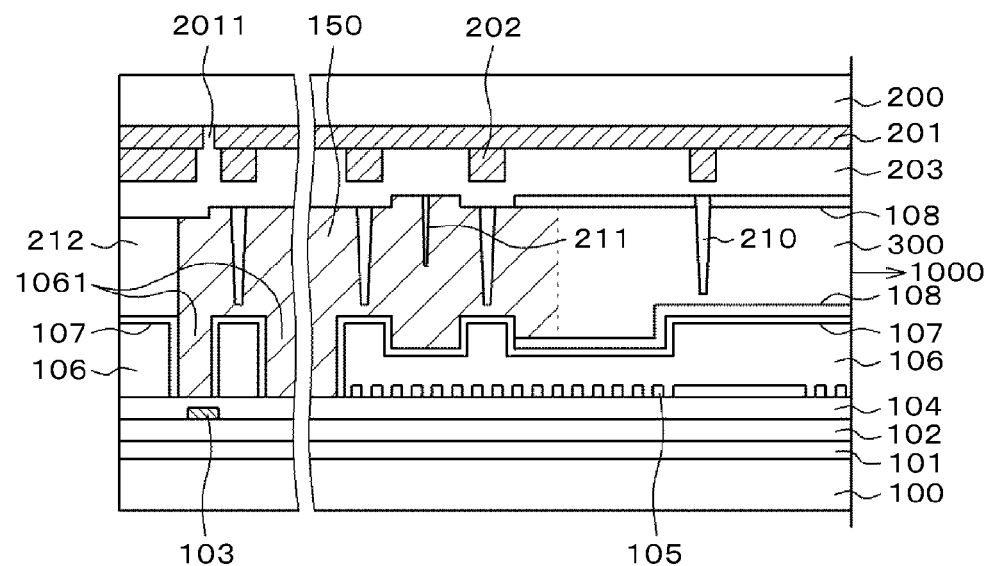
FIG. 20 is a cross-sectional view of a seal part.

FIG. 20 is a cross-sectional view of a seal part of a liquid crystal display panel as a cross-sectional view taken along the line A-A in FIG. 9, for example. FIG. 20 is a cross-sectional view of a seal part corresponding to a liquid crystal display device of the IPS type. The IPS type, controlling the transmittance of each pixel by rotating the liquid crystal molecules, has excellent viewing angle characteristics. In the IPS type, on a first electrode formed in a planar shape on the TFT substrate's side, a second electrode having slits is formed to sandwich a capacitive insulation film between the first and second electrodes. The transmittance of each pixel is controlled by applying voltage between the first and second electrodes to rotate the liquid crystal molecules. There are cases where the first electrode is the common electrode and the second electrode is the pixel electrode. There are also cases where the first electrode is the pixel electrode and the second electrode is the common electrode. The capacitive insulation film is referred to as that because capacitance is formed between the first electrode and the second electrode.

In FIG. 20, the TFT substrate 100 and the counter substrate 200 face each other across the liquid crystal 300. On the TFT substrate 100's side, a base film 101, a gate insulation film 102 and an interlayer insulation film 104 are stacked up in this order. The base film 101 prevents the entry of impurities from glass, etc. into a semiconductor layer of the TFT. The base film 101 is formed of $SiO_2$ or SiN depending on the case. There are also cases where the base film 101 is formed as a two-layer film made up of a $SiO_2$ film and a SiN film. The gate insulation film 102 insulates the gate electrode and the semiconductor layer of the TFT. The interlayer insulation film 104 insulates video signal lines and scan lines formed in the same layer as the gate electrode. In FIG. 20, lead wires 105 of the video signal lines are arranged on the interlayer insulation film 104.

An organic passivation film 106 is formed to cover the interlayer insulation film 104 and the lead wires 105 of the video signal lines. The organic passivation film 106 serves also as a planarization film in the display region 1000, and thus is formed to be as thick as 2-3 μm. On the organic passivation film 106, a capacitive insulation film 107 is formed. On the capacitive insulation film 107, an alignment layer 108 is formed. Roughness formed on the organic passivation film 106 serve as stoppers for the alignment layer 108. Specifically, the roughness prevent the alignment layer 108 from extending widely under the seal member 150. Grooves 1061 formed through the organic passivation film 106 work as stoppers when moisture penetrates into the organic passivation film 106 from the outside.

On the counter substrate 200, the black matrix in the display region 1000 is formed as a light blocking film 201. A groove 2011 is formed through the light blocking film 201. The groove 2011 blocks moisture penetrating through the light blocking film 201 formed of organic material. To prevent light leakage through this part, a metallic light blocking film 103 is formed on the gate insulation film 102 on the TFT substrate 100's side. Color filters 202 are formed on the light blocking film 201. While the color filters 202 are fundamentally unnecessary in the seal part, the color filters 202 are used as bases for columnar spacers 210 which will be explained later and serve to adjust the height of the columnar spacers 210.

An overcoat film 203 is formed to cover the color filters 202 and the light blocking film 201. On the overcoat film 203, main columnar spacers 210 and subsidiary columnar spacer 211 are formed. The main columnar spacers 210 determine the distance between the TFT substrate 100 and the counter substrate 200. The subsidiary columnar spacers 211 prevent the distance between the TFT substrate 100 and the counter substrate 200 from decreasing excessively when the counter substrate 200 receives pushing pressure from the outside. While the main columnar spacers 210 in the display region 1000 are in contact with the TFT substrate 100's side, a slight gap exists between each main columnar spacer 210 and the TFT substrate 100 in FIG. 20. This is because no pedestals corresponding to the main columnar spacers 210 are formed on the TFT substrate 100 in the seal part.

In FIG. 20, another alignment layer 108 is formed on the overcoat film 203 of the counter substrate 200. The TFT substrate 100 and the counter substrate 200 are bonded to each other with the seal member 150. The liquid crystal 300 is sealed up inside the seal member 150. A bank-like spacer 212 is formed in the left end of FIG. 20. Each liquid crystal display panel 400 is separated from a mother substrate by means of scribing and impact. The bank-like spacer 212 is formed to facilitate the separation of each liquid crystal display panel 400.

The width of the seal member in FIG. 20 is greater than the normal value sw by swd. For example, assuming that the width of the seal member on the long side in FIG. 9 is swb, the width swa of the seal member on the short side is swb+swd. In parts where the width of the seal member is increased as above, the organic passivation film 106 is not absolutely necessary. With such a region where the organic passivation film 106 is removed, the volume of the seal member 150 can be increased correspondingly and the reliability of the bonding can be improved. Thus, the ratio of the region where the organic passivation film 106 is removed may be increased in the parts where the width of the seal member is increased in comparison with parts where the seal width is not increased. Further, in the parts where the width of the seal member is increased, the density of the columnar spacers may also be increased in order to enhance the adhesive force of the seal in comparison with the parts where the seal width is not increased. Incidentally, the columnar spacers are not limited to spacers in columnar shapes but can also be spacers in conic shapes, rectangular prism-like shapes, etc.

Figure 21A:
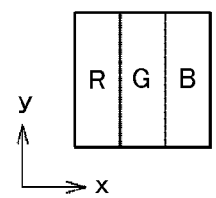
FIG. 21A is a plan view showing an arrangement of pixels.
Figure 21B:
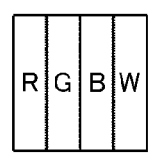
FIG. 21B is a plan view showing another arrangement of pixels.

FIGS. 21A to 27 are diagrams showing various examples in accordance with the present invention. FIGS. 21A to 21H are plan views showing various pixel arrangements. FIG. 21A illustrates a state in which a red pixel R, a green pixel G and a blue pixel B are arranged in the x direction. FIG. 21B illustrates a state in which a red pixel R, a green pixel G, a blue pixel B and a white pixel W are arranged in the x direction. The white pixel W is a pixel in which no color filter is formed. The white pixels W are used to increase the brightness of the screen. FIGS. 21C and 21D illustrate states in which the pixels shown in FIGS. 21A and 21B are arranged in the y direction.

FIG. 21E shows an example in which four pixels (i.e., a red pixel R, two green pixels G and a blue pixel B) are arranged in the x direction (curvature axis direction) and in the y direction in a rectangular shape. This arrangement is employed to increase the luminance by increasing the area of green pixels having high luminous efficiency. FIG. 21F shows an example in which a red pixel R, a green pixel G, a blue pixel B and a white pixel W are arranged in the x and y directions in a rectangular shape. FIG. 21G shows a pixel arrangement obtained by changing the pixel positions in the arrangement of FIG. 21E. FIG. 21H shows a pixel arrangement obtained by changing the pixel positions in the arrangement of FIG. 21F.

A to E of FIG. 22 show examples in which the long axis direction (x-axis direction) of the liquid crystal display panel is the curvature axis direction and the terminal unit 160 is arranged on a short side of the liquid crystal display panel. A and B of FIG. 22 show an example not employing the present invention, wherein the width of the seal member is equal between the short sides and the long sides. C, D and E of FIG. 22 show a first example according to the present invention, wherein the configuration explained above is employed. In the pixels formed in the display region 1000 in C of FIG. 22, a red pixel R, a green pixel G and a blue pixel B are arranged in the curvature axis direction, or a red pixel R, a green pixel G, a blue pixel B and a white pixel W are arranged in the curvature axis direction. D of FIG. 22 shows a case where the external form of the upper polarizing plate 220 bonded to the counter substrate 200's side or the lower polarizing plate 120 bonded to the TFT substrate 100's side is smaller than that of the counter substrate 200. E of FIG. 22 shows a case where the external form of the upper polarizing plate 220 bonded to the counter substrate 200's side or the lower polarizing plate 120 bonded to the TFT substrate 100's side is of the same size as the counter substrate 200. The effect achieved is equivalent to the effect explained referring to FIGS. 3A to 4B. In C to E of FIG. 22, the seal member 150 on each short side has a width increased by the seal width increment swd, by which the pixel deviation di between the TFT substrate 100's side and the counter substrate 200's side is reduced.

Figure 23:
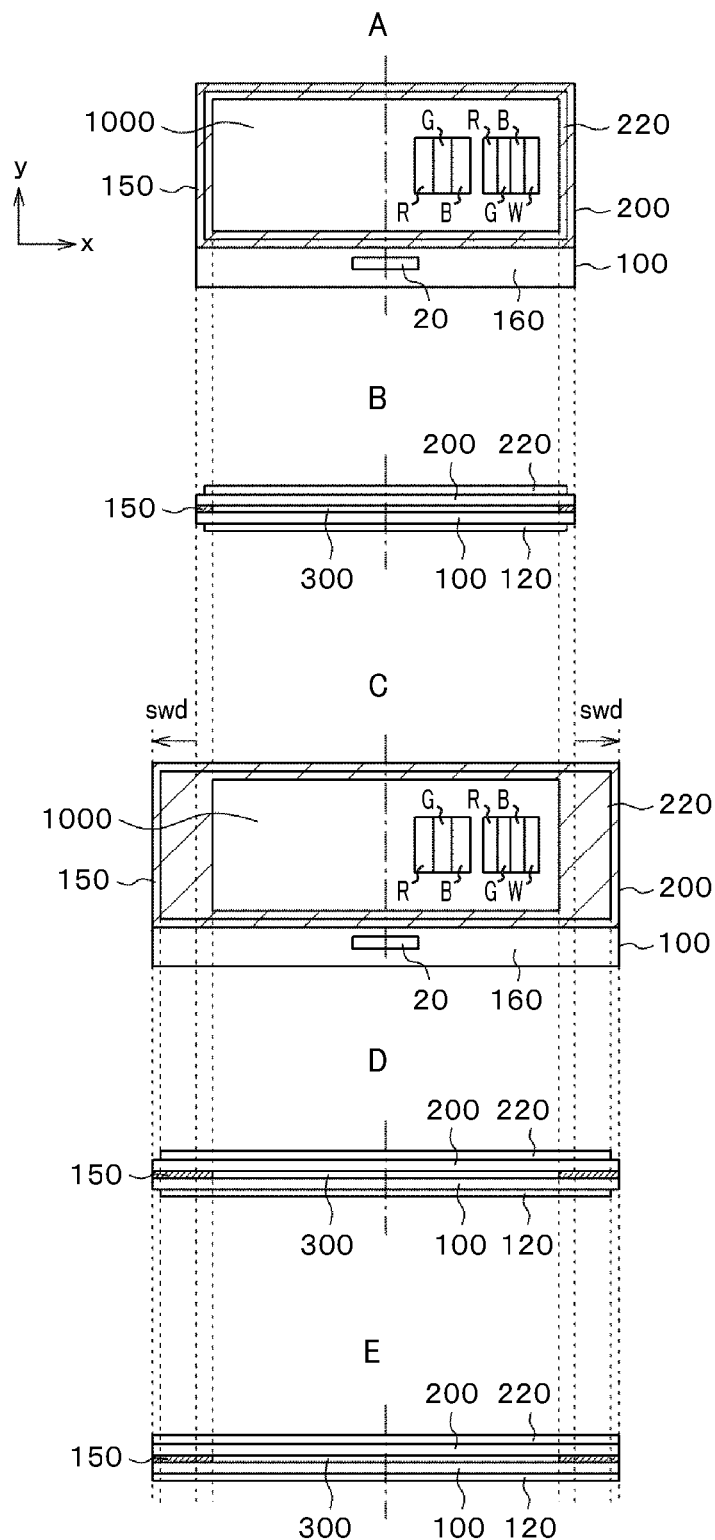
FIG. 23 is a diagram for explaining characteristics of a configuration according to the present invention in a case where the terminal unit is arranged on a long side of the liquid crystal display panel.

A to E of FIG. 23 show examples in which the long axis direction of the liquid crystal display panel is the curvature axis direction and the terminal unit 160 is arranged on a long side of the liquid crystal display panel. A and B of FIG. 23 show an example not employing the present invention, wherein the width of the seal member is equal between the short sides and the long sides. C, D and E of FIG. 23 show a second example according to the present invention, wherein the terminal unit 160 is arranged on a long side. The pixel arrangement is the same as that in A to E of FIG. 22. D of FIG. 23 shows a case where the external form of the upper polarizing plate 220 bonded to the counter substrate 200's side or the lower polarizing plate 120 bonded to the TFT substrate 100's side is smaller than that of the counter substrate 200. E of FIG. 23 shows a case where the external form of the upper polarizing plate 220 bonded to the counter substrate 200's side or the lower polarizing plate 120 bonded to the TFT substrate 100's side is of the same size as the counter substrate 200. The effect achieved is equivalent to the effect explained referring to FIGS. 3A to 4B. In C to E of FIG. 23, the seal member 150 on each short side has a width increased by the seal width increment swd, by which the pixel deviation di between the TFT substrate 100's side and the counter substrate 200's side is reduced.

Figure 24:
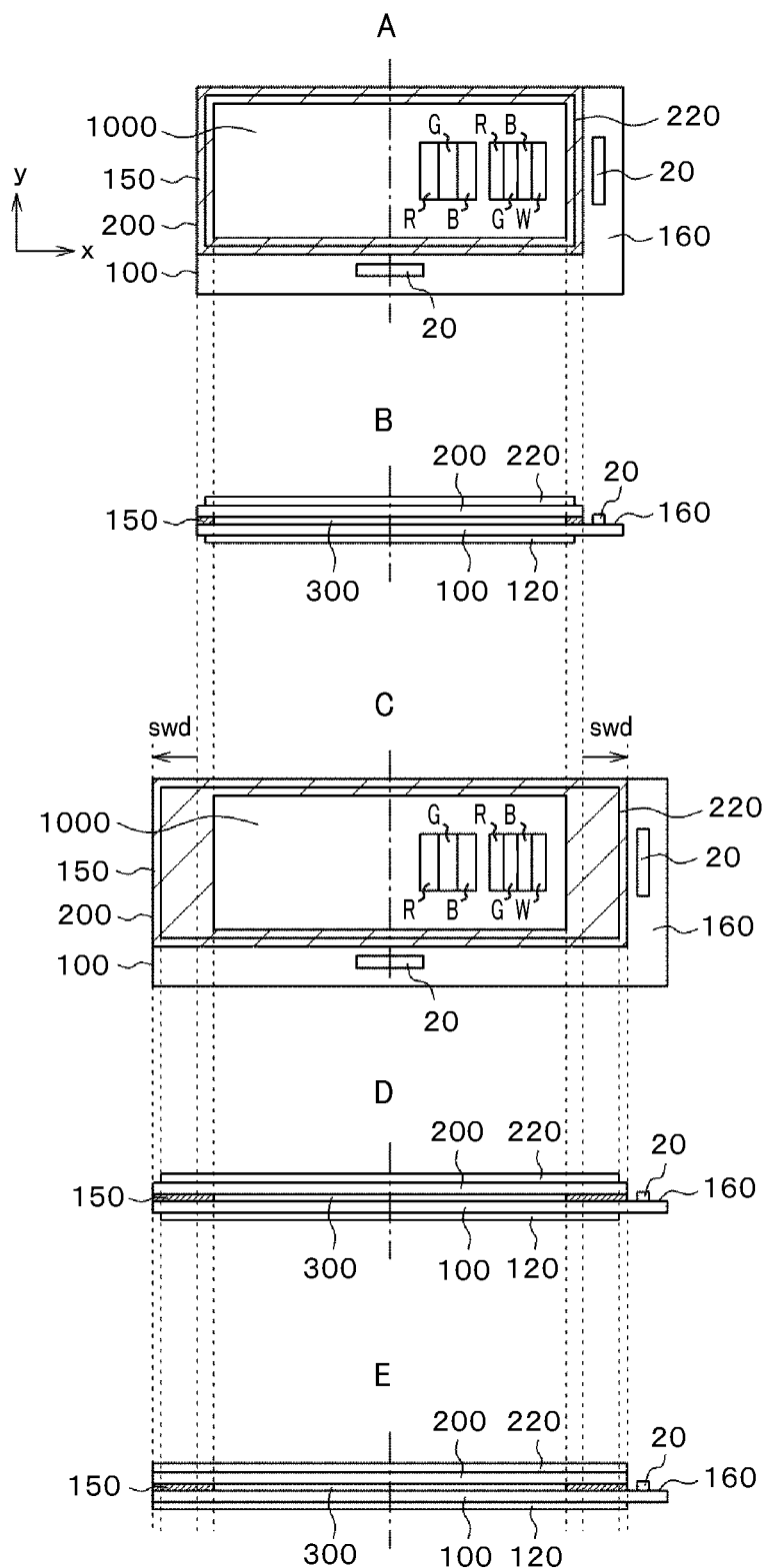
FIG. 24 is a diagram for explaining characteristics of a configuration according to the present invention in a case where the terminal unit is arranged on a short side and a long side of the liquid crystal display panel.

A to E of FIG. 24 show examples in which the long axis direction of the liquid crystal display panel is the curvature axis direction and the terminal unit 160 is arranged on a short side and a long side of the liquid crystal display panel. A and B of FIG. 24 show an example not employing the present invention, while C, D and E of FIG. 24 show an example employing the present invention. The effect of the example shown in C, D and E of FIG. 24 is equivalent to that explained referring to C, D and E of FIG. 22 and C, D and E of FIG. 23.

Figure 25:
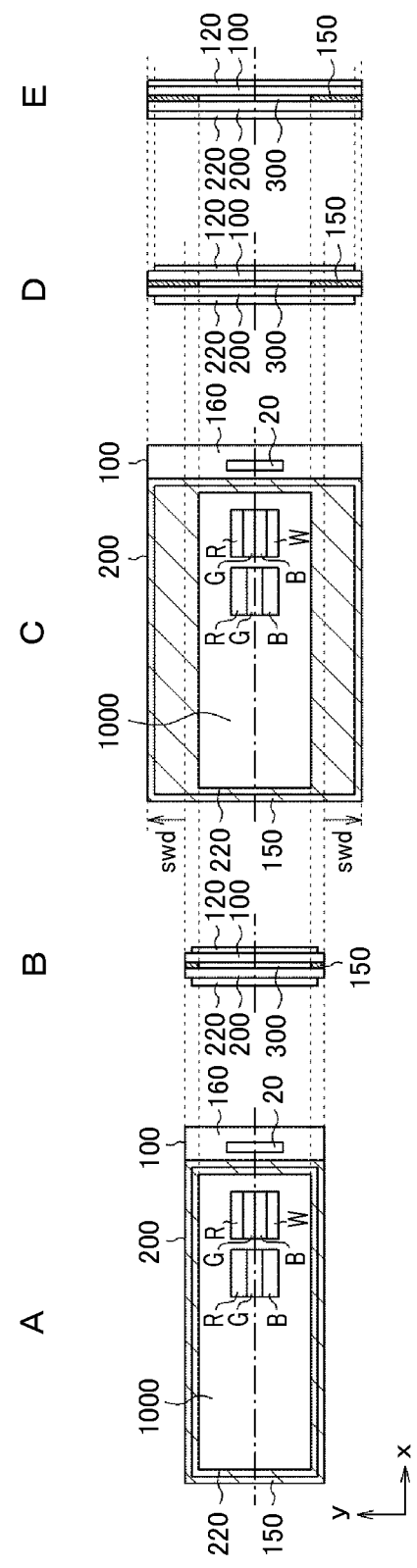
FIG. 25 is a diagram for explaining characteristics of a configuration according to the present invention in a case where a curvature axis of the liquid crystal display panel is in a short axis direction and the terminal unit is arranged on a short side of the liquid crystal display panel.

A to E of FIG. 25 show examples in which the liquid crystal display panel is curved in the short axis direction and the terminal unit 160 exists on a short side of the liquid crystal display panel. A and B of FIG. 25 show an example not employing the present invention, while C, D and E of FIG. 25 show an example employing the present invention. In the pixels formed in the display region 1000 in C of FIG. 25, a red pixel R, a green pixel G and a blue pixel B are arranged in the curvature axis direction, or a red pixel R, a green pixel G, a blue pixel B and a white pixel W are arranged in the curvature axis direction. In C of FIG. 25, the seal member 150 on each long side is made wider than on each short side by the seal width increment swd, by which the deviation di due to the lift de when the liquid crystal display panel is curved can be reduced.

D of FIG. 25 shows a case where the external form of the upper polarizing plate 220 bonded to the counter substrate 200's side or the lower polarizing plate 120 bonded to the TFT substrate 100's side is smaller than that of the counter substrate 200. E of FIG. 25 shows a case where the external form of the upper polarizing plate 220 bonded to the counter substrate 200's side or the lower polarizing plate 120 bonded to the TFT substrate 100's side is of the same size as the counter substrate 200. The effect achieved is equivalent to the effect explained referring to FIGS. 3A to 4B. Namely, also when the liquid crystal display panel is curved in the short axis direction, similarly to the cases where the liquid crystal display panel is curved in the long axis direction, the pixel deviation di can be reduced and the color irregularity caused by the color mixture can be restrained by employing the present invention.

Figure 26:
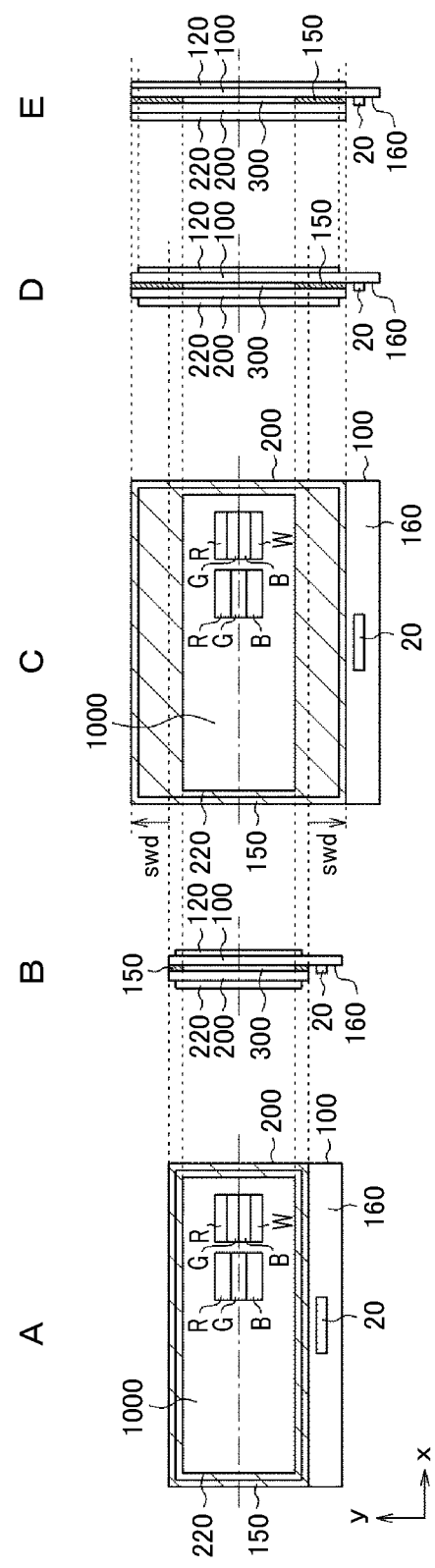
FIG. 26 is a diagram for explaining characteristics of a configuration according to the present invention in a case where the curvature axis of the liquid crystal display panel is in the short axis direction and the terminal unit is arranged on a long side of the liquid crystal display panel.

A to E of FIG. 26 show examples in which the liquid crystal display panel is curved in the short axis direction and the terminal unit 160 exists on a long side of the liquid crystal display panel. A and B of FIG. 26 show an example not employing the present invention, while C, D and E of FIG. 26 show an example employing the present invention. The examples shown in A to E of FIG. 26 are equivalent to those explained referring to A to E of FIG. 25 except that the terminal unit 160 is arranged on a long side. The effect of the example shown in C, D and E of FIG. 26 is also equivalent to the effect explained referring to C, D and E of FIG. 25.

Figure 27:
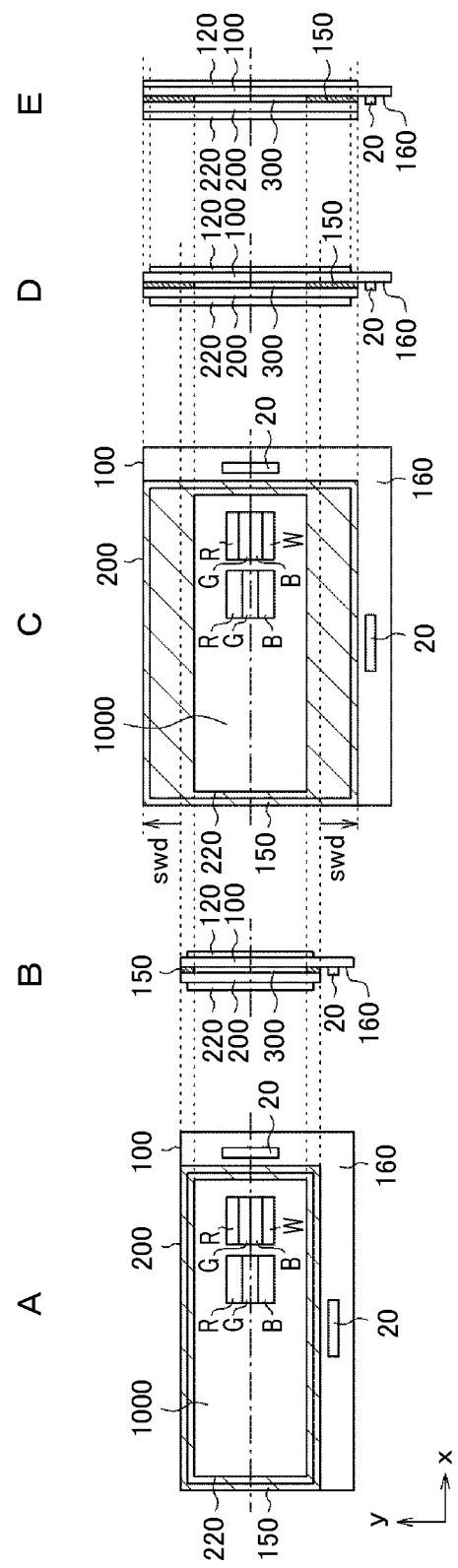
FIG. 27 is a diagram for explaining characteristics of a configuration according to the present invention in a case where the curvature axis of the liquid crystal display panel is in the short axis direction and the terminal unit is arranged on a long side and a short side of the liquid crystal display panel.

A to E of FIG. 27 show examples in which the liquid crystal display panel is curved in the short axis direction and the terminal unit 160 exists on a long side and a short side of the liquid crystal display panel. A and B of FIG. 27 show an example not employing the present invention, while C, D and E of FIG. 27 show an example employing the present invention. The examples shown in A to E of FIG. 27 are equivalent to those explained referring to A to E of FIG. 25 except that the terminal unit 160 is arranged on a long side and a short side. The effect of the example shown in C, D and E of FIG. 27 is also equivalent to the effect explained referring to C, D and E of FIG. 25.

Second Embodiment

Figure 28:
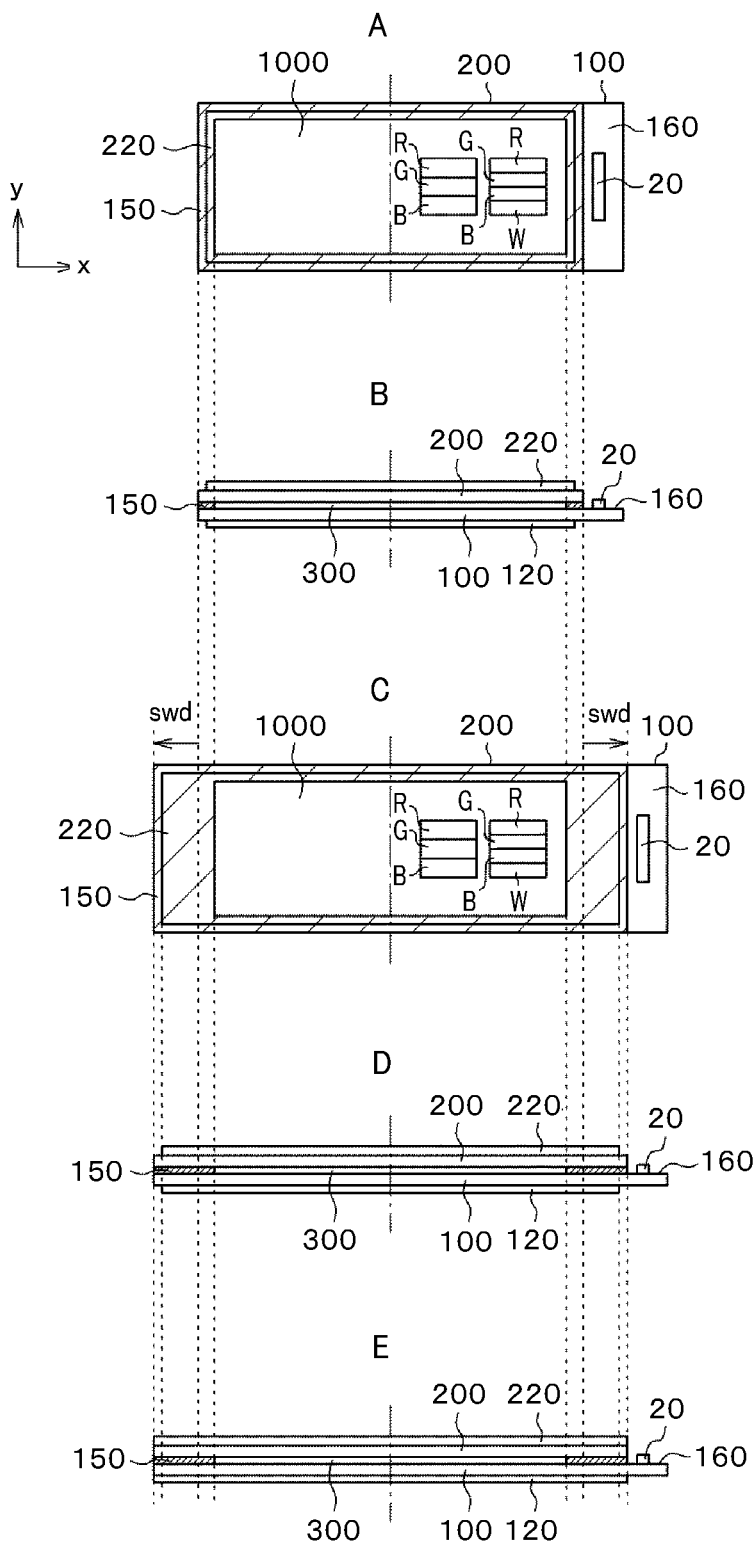
FIG. 28 is a diagram for explaining characteristics of a configuration according to the present invention in a case where the curvature axis is in a long axis direction and pixels are arranged in a direction orthogonal to the curvature axis in a second embodiment.

A to E of FIG. 28 are diagrams showing a first example in a second embodiment. In A to E of FIG. 28, the curvature axis is in the long axis direction. While the configurations shown in A to E of FIG. 28 correspond to A to E of FIG. 22 in the first embodiment, the pixel arrangement differs from that in A to E of FIG. 22. In A to E of FIG. 28, the pixels are arranged in the direction orthogonal to the curvature axis. Specifically, a red pixel R, a green pixel G and a blue pixel B are arranged in the direction orthogonal to the curvature axis direction, or a red pixel R, a green pixel G, a blue pixel B and a white pixel W are arranged in the direction orthogonal to the curvature axis direction. With such pixel arrangements, the color mixture can be prevented even when the deviation di occurs between the pixels on the TFT substrate 100's side and the pixels on the counter substrate 200's side. This is because pixels of the same color are arranged in the direction of the curvature axis.

In the case of A and B of FIG. 28, even though the color mixture can be prevented, a decrease in the resolution occurs since information from adjoining pixels comes into the visual field. In contrast, the decrease in the resolution can be prevented by employing the configuration shown in C, D and E of FIG. 28. Specifically, by setting the width of the seal member 150 on each short side to be greater than the width on each long side by swd in C of FIG. 28, the pixel deviation di can be reduced and the degradation of the resolution can be prevented. The reason is the same as that explained in the first embodiment.

In the examples shown in A to E of FIG. 28, the terminal unit 160 is arranged on a short side. The contents of the above explanation given with reference to A to E of FIG. 28 are applicable also to configurations in which the curvature axis is the long axis and the terminal unit 160 is arranged on a long side and configurations in which the terminal unit 160 is arranged on a short side and a long side.

Figure 29:
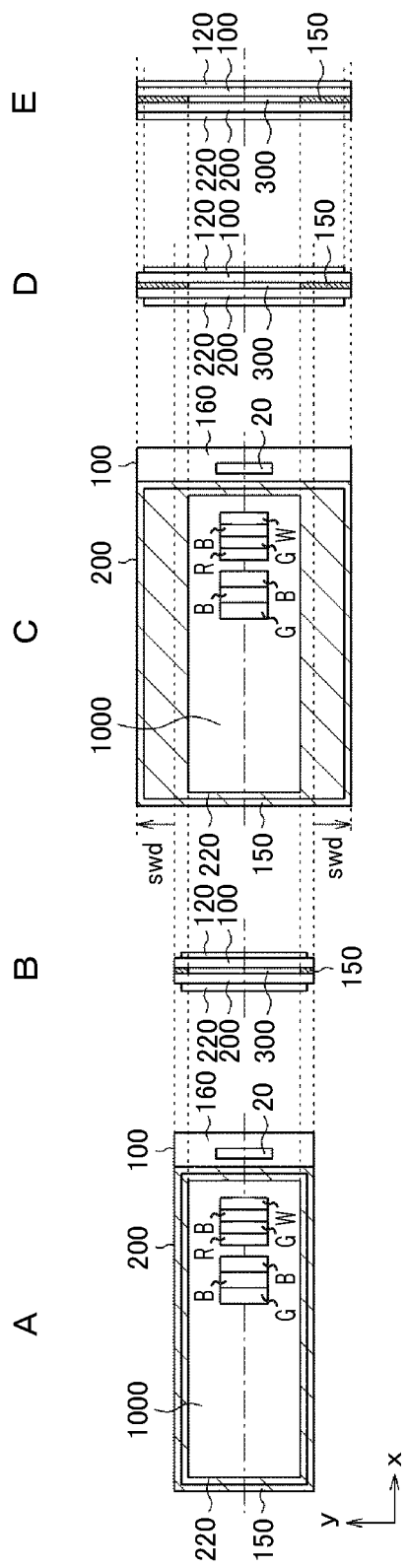
FIG. 29 is a diagram for explaining characteristics of a configuration according to the present invention in a case where the curvature axis is in the short axis direction and pixels are arranged in a direction orthogonal to the curvature axis in the second embodiment.

A to E of FIG. 29 are diagrams showing a second example in the second embodiment. In A to E of FIG. 29, the curvature axis is in the short axis direction. While the configurations shown in A to E of FIG. 29 correspond to A to E of FIG. 25 in the first embodiment, the pixel arrangement differs from that in A to E of FIG. 25. In A to E of FIG. 29, the pixels are arranged in the direction orthogonal to the curvature axis. Specifically, a red pixel R, a green pixel G and a blue pixel B are arranged in the direction orthogonal to the curvature axis direction, or a red pixel R, a green pixel G, a blue pixel B and a white pixel W are arranged in the direction orthogonal to the curvature axis direction. With such pixel arrangements, the color mixture can be prevented even when the deviation di occurs between the pixels on the TFT substrate 100's side and the pixels on the counter substrate 200's side. This is because pixels of the same color are arranged in the direction of the curvature axis.

In the case of A and B of FIG. 29, even though the color mixture can be prevented, a decrease in the resolution occurs since information from adjoining pixels comes into the visual field. In contrast, the decrease in the resolution can be prevented by employing the configuration shown in C, D and E of FIG. 29. Specifically, by setting the width of the seal member 150 on each long side to be greater than the width on each short side by swd in C of FIG. 29, the pixel deviation di can be reduced and the degradation of the resolution can be prevented. The reason is the same as that explained in the first embodiment.

In the examples shown in A to E of FIG. 29, the terminal unit 160 is arranged on a short side. The contents of the above explanation given with reference to A to E of FIG. 29 are applicable also to configurations in which the curvature axis is the short axis and the terminal unit 160 is arranged on a long side and configurations in which the terminal unit 160 is arranged on a short side and a long side.

As explained above, the color mixture occurring when the liquid crystal display panel is curved can be prevented by arranging the pixels in the direction orthogonal to the curvature axis. Further, by setting the width of the seal member on each side extending in the direction orthogonal to the curvature axis to be greater than the width of the seal member on each side extending in the direction parallel to the curvature axis, the pixel deviation di can be reduced and the decrease in the resolution when the liquid crystal display panel is curved can be restrained.

Third Embodiment

Figure 30:
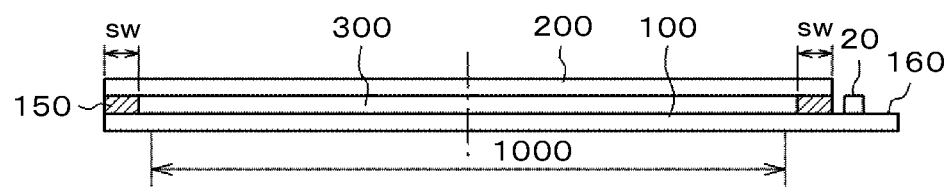
FIG. 30 is a cross-sectional view of a liquid crystal display panel in a case where the present invention is not employed.
Figure 31:
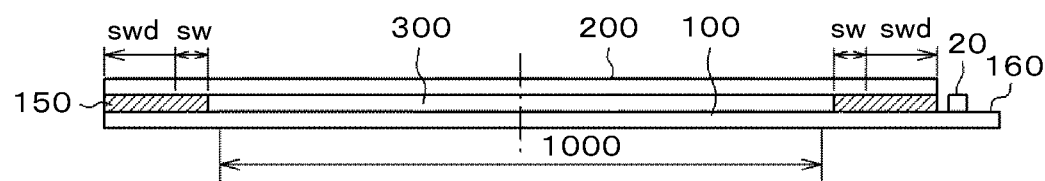
FIG. 31 is a cross-sectional view of a liquid crystal display panel in accordance with the present invention.
Figure 32:
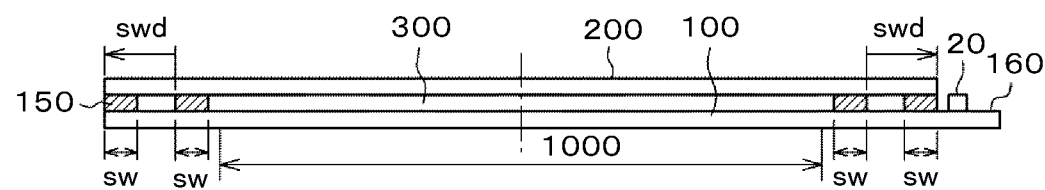
FIG. 32 is a cross-sectional view of a liquid crystal display panel in accordance with a third embodiment of the present invention.

FIGS. 30 to 32 are cross-sectional views taken in the direction parallel to the curvature axis of the liquid crystal display panel. FIG. 30 is a cross-sectional view of a liquid crystal display panel in a case where the present invention is not employed. In FIG. 30, the cross section of the seal member 150 on each side extending in the direction orthogonal to the curvature axis is shown, wherein the width sw of the seal member 150 is equal to that on each side extending in the direction parallel to the curvature axis.

FIG. 31 is a cross-sectional view of a liquid crystal display panel employing the present invention. In FIG. 31, the width of the seal member 150 is made greater than the width sw of the seal member 150 shown in FIG. 30 by swd, by which the pixel deviation di is reduced and the color mixture is restrained. FIG. 31 shows an example in which the width of the seal member 150 itself is increased.

FIG. 32 is a cross-sectional view showing another example of a liquid crystal display panel employing the present invention. In FIG. 32, the width of each region where the seal member 150 is formed is made wider than the width sw of the seal member 150 shown in FIG. 30 by swd. The difference from FIG. 31 is that two narrow seal members 150 are formed. The width of each of the two seal members 150 is equal to the width of the seal member 150 in FIG. 30. Between the two seal members 150, spacers for determining the distance between the substrates, a drive circuit, etc. can be arranged as needed.

Even configurations like that shown in FIG. 32 are capable of reducing the pixel deviation di explained in the first embodiment occurring when the liquid crystal display panel is curved.

Figure 33:
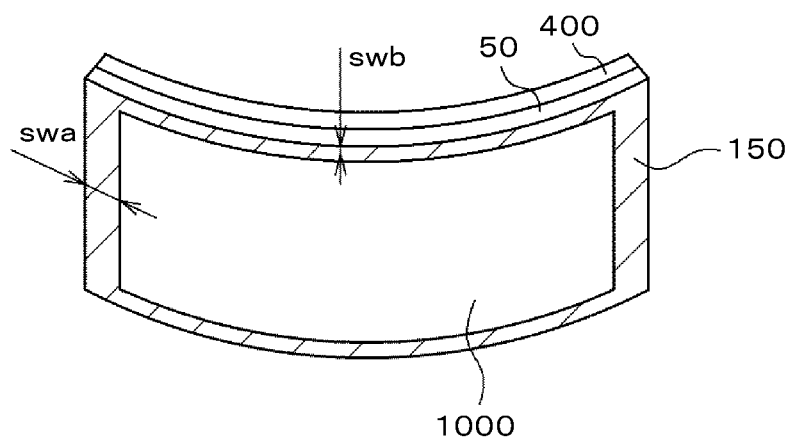
FIG. 33 is a perspective view of a liquid crystal display device in a case where the screen of the liquid crystal display device is convex on the viewer's side.
Figure 34:
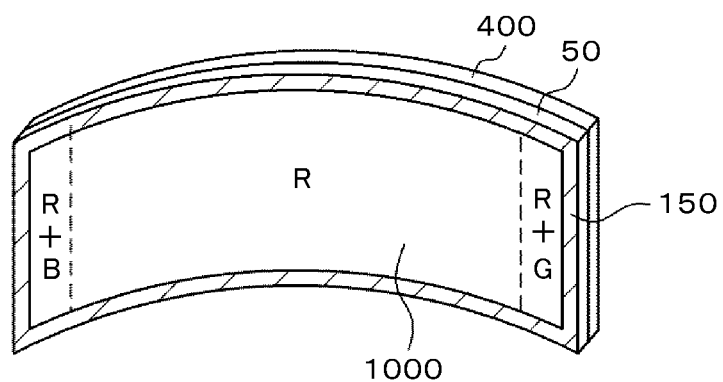
FIG. 34 is a perspective view showing the color irregularity occurring on a liquid crystal display device having a curved screen.
Figure 35:
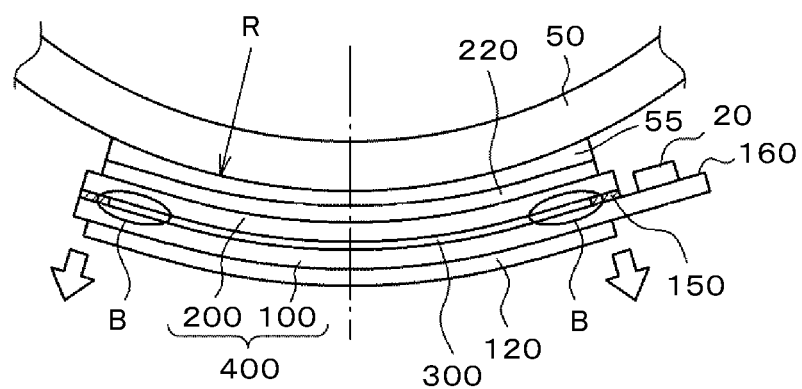
FIG. 35 is a cross-sectional view of a liquid crystal display device for explaining the cause of the color irregularity shown in FIG. 34.

The above description has been given of displays having a screen concave on the viewer's side. However, the contents of the present invention are applicable also to cases where the screen is convex on the viewer's side as shown in FIG. 33. Specifically, in FIG. 33, the width wsa of the seal member 150 on each side extending in the direction orthogonal to the curvature axis is greater than the width wsb of the seal member 150 on each side extending in the direction parallel to the curvature axis. In other words, the contents of the present invention described in the first through third embodiments are applicable even if the screen is convex on the viewer's side. The influence of the color mixture due to the deviation di between the TFT substrate and the counter substrate increases in cases where the color filters are formed on the counter substrate. While configurations in which the color filters are formed on the TFT substrate's side have been proposed, the color mixture due to the deviation can occur even in these configurations. On the counter substrate's side, a light blocking film such as the black matrix is formed corresponding to the pixels on the TFT substrate. There are cases where part of each pixel normally allowing through light blocks light due to the deviation. In such cases, the light transmittance is necessitated to drop. While curved screen display devices employing a liquid crystal display panel have been described in this specification, the present invention is not limited to such display devices but is applicable also to curved display devices employing a different type of display panel such as an organic EL display panel using color filters, for example.

What is claimed is:

1. A display device comprising a display panel having a curved surface along a curved axis and a straight axis that is orthogonal to the curved axis, the display panel comprises a TFT substrate having pixels, a counter substrate, and a seal surrounding a display area and bonding the TFT substrate and the counter substrate to each other, wherein:
   the seal has an inner edge and an outer edge,
   the display area is defined by the inner edge of the seal,
   the display panel has a first side parallel to the straight axis and a second side parallel to the curved axis,
   each of the pixels has a long side and a short side,
   the long side is set in a direction parallel to the curved axis,
   the counter substrate has a red color filter corresponding to a red pixel, a green color filter corresponding to a green pixel, and a blue color filter corresponding to a blue pixel,
   each of the color filters extend in the direction parallel to the curved axis, and is arranged in a direction parallel to the straight axis,
   the seal has a first portion along the first side and a second portion along the second side, a width of the first portion in the direction of the curved axis is greater than a width of the second portion in the direction of the straight axis,
   a protective plate having a curved surface is attached to the counter substrate,
   the counter substrate has a first thickness and the TFT substrate has a second thickness,
   a thickness of the protective plate is greater than a total thickness of the first thickness and the second thickness, and
   provided a length of the display area on the curved axis is x, a deviation between one of the color filters and a pixel corresponding to the one of the color filters is maximum between an edge of the display area and a point x/8 inside from the edge of the display area on the curved axis.

2. A display device comprising a display panel having a curved surface along a curved axis and a straight axis that is orthogonal to the curved axis, the display panel comprises a TFT substrate having pixels, a counter substrate having color filters, and a seal surrounding a display area and provided between the TFT substrate and the counter substrate, wherein:
   the seal has an inner edge and an outer edge,
   the display area is defined by the inner edge of the seal,
   the display panel has a first side and a second side parallel to the straight axis and a third side and a fourth side parallel to the curved axis,
   the seal has a first portion along the first side, a second portion along the second side, a third portion along the third side, a fourth portion along the fourth side,
   a width of the first portion and a width of the second portion in the direction of the curved axis are greater than a width of the third portion and a width of the fourth portion in the direction of the straight axis,
   each of the pixels has a long side and a short side,
   the long side is set parallel to the curved axis,
   the short side is set parallel to the straight axis,
   the color filters comprise a red color filter corresponding to a red pixel, a green color filter corresponding to a green pixel, a blue color filter corresponding to a blue pixel,
   each of the red color filter and the green color filter and the blue color filter is arranged in a direction parallel to the curved axis,
   the red color filter, the green color filter and the blue color filter are arranged in a direction parallel to the straight axis, and
   provided a length of the display area on the curved axis is x, a deviation between one of the color filters and a pixel corresponding to the one of the color filters is maximum between an edge of the display area and a point x/8 inside from the edge of the display area on the curved axis.

* * * * *